(12) United States Patent
Mori et al.

(10) Patent No.: US 11,478,858 B2
(45) Date of Patent: Oct. 25, 2022

(54) COATED TOOL, CUTTING TOOL, AND METHOD FOR MANUFACTURING MACHINED PRODUCT

(71) Applicant: KYOCERA CORPORATION, Kyoto (JP)

(72) Inventors: Satoshi Mori, Satsumasendai (JP); Risa Kouda, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 348 days.

(21) Appl. No.: 16/624,942

(22) PCT Filed: Jun. 15, 2018

(86) PCT No.: PCT/JP2018/022998
§ 371 (c)(1),
(2) Date: Dec. 20, 2019

(87) PCT Pub. No.: WO2018/235747
PCT Pub. Date: Dec. 27, 2018

(65) Prior Publication Data
US 2021/0060658 A1 Mar. 4, 2021

(30) Foreign Application Priority Data
Jun. 20, 2017 (JP) .............................. JP2017-120677

(51) Int. Cl.
*B23B 27/14* (2006.01)
*B23B 1/00* (2006.01)
(Continued)

(52) U.S. Cl.
CPC .............. *B23B 27/148* (2013.01); *B23B 1/00* (2013.01); *C23C 28/021* (2013.01);
(Continued)

(58) Field of Classification Search
CPC ....... B23B 27/14; B23B 27/148; B23B 29/00; C23C 28/42; C23C 28/44; C23C 2224/24; C23C 2228/105
(Continued)

(56) References Cited

U.S. PATENT DOCUMENTS

2004/0026236 A1* 2/2004 Penich ................ C23C 14/0664
428/704
2012/0308845 A1 12/2012 Yun et al.
(Continued)

FOREIGN PATENT DOCUMENTS

JP 2013518734 A 5/2013
JP 2016130344 A 7/2016
(Continued)

*Primary Examiner* — Archene A Turner
(74) *Attorney, Agent, or Firm* — Viering, Jentschura & Partner mbB

(57) ABSTRACT

A coated tool may include a base member and a coating layer. The coating layer may include a plurality of first AlTi layers indicated by $Al_{1-x1}Ti_{x1}$ and a plurality of second AlTi layers indicated by $Al_{1-x2}Ti_{x2}$. The coating layer may have alternating first AlTi layers and second AlTi layers, i.e. one upon another in a direction away from the base member, and x1 may be larger than x2. The plurality of first AlTi layers may include a first region having two or more adjacent first AlTi layers, where a first AlTi layer of the two or more adjacent first AlTi layers is located farther away from the base member and is smaller in thickness than a first AlTi layer of the two or more adjacent first AlTi layers located closer to the base member.

16 Claims, 26 Drawing Sheets

(51) Int. Cl.
*C23C 28/02* (2006.01)
*C23C 28/00* (2006.01)

(52) U.S. Cl.
CPC ............ *C23C 28/023* (2013.01); *C23C 28/42* (2013.01); *C23C 28/44* (2013.01); *B23B 2222/04* (2013.01); *B23B 2228/10* (2013.01)

(58) Field of Classification Search
USPC .................................................. 428/216, 697
See application file for complete search history.

(56) References Cited

U.S. PATENT DOCUMENTS

2018/0071829 A1    3/2018   Hirano
2019/0247930 A1    8/2019   Tanaka et al.

FOREIGN PATENT DOCUMENTS

| WO | 2015147241 A1 | 10/2015 |
| WO | 2018100849 A1 | 6/2018 |

\* cited by examiner

US 11,478,858 B2

COATED TOOL, CUTTING TOOL, AND METHOD FOR MANUFACTURING MACHINED PRODUCT

CROSS-REFERENCE TO RELATED APPLICATIONS

The present application is a national stage entry according to 35 U.S.C. § 371 of PCT application No.: PCT/JP2018/022998 filed on Jun. 15, 2018; which claims priority to Japanese Patent Application Serial No.: 2017-120677, which was filed on Jun. 20, 2017; both of which are incorporated herein by reference in their entirety and for all purposes.

TECHNICAL FIELD

The present disclosure relates to a coated tool for use in a cutting process.

BACKGROUND

As a coated tool for use in cutting processes, such as a turning process and a milling process, a coated tool including a hard coating described in Japanese Unexamined Patent Publication No. 2016-130344 (Patent Document 1), for example, has been known. The hard coating described in Patent Document 1 includes a structure in which a $Ti_{1-x1}Al_{x1}N$ phase (first phase) and an $Al_{x2}Ti_{1-x2}N$ phase (second phase) are alternately laminated one upon another. Here, values of x1 and x2 each indicating a content ratio in terms of atomic ratio of Ti and Al in each phase are $0.1 \leq x1 \leq 0.7$ and $0.7 \leq x2 \leq 0.95$.

The first phase has high hardness because it includes a relatively large amount of Al. The second phase has excellent toughness because it includes a relatively large amount of Ti. Since the hard coating described in Patent Document 1 has a structure in which the first phase and the second phase are alternately laminated one upon another, it is a coating (coating layer) excellent in wear resistance and joinability.

In recent years, there has been a demand for a coated tool including a coating layer having still more excellent wear resistance and joinability. Here, if the thickness of the first phase is increased in order to enhance the wear resistance, the joinability between the base member and the coating layer is lowered. If the thickness of the second phase is increased in order to enhance the joinability, the wear resistance of the coating layer is lowered. Therefore, it was difficult to further improve both wear resistance and joinability.

SUMMARY

A coated tool in a first embodiment includes a base member and a coating layer located on the base member. The coating layer includes a plurality of first AlTi layers with a content ratio in terms of atomic ratio of aluminum and titanium indicated by $Al_{1-x1}Ti_{x1}$, and a plurality of second AlTi layers with a content ratio in terms of atomic ratio of aluminum and titanium indicated by $Al_{1-x2}Ti_{x2}$. The coating layer includes a configuration in which the first AlTi layers and the second AlTi layers are alternately located one upon another in a direction away from the base member. The x1 is larger than the x2. The plurality of first AlTi layers include a first region in which, of adjacent two first AlTi layers, the first AlTi layer located farther away from the base member is smaller in thickness than the first AlTi layer located closer to the base member.

A coated tool in a second embodiment includes a base member and a coating layer located on the base member. The coating layer includes a plurality of first AlTi layers with a content ratio in terms of atomic ratio of aluminum and titanium indicated by $Al_{1-x1}Ti_{x1}$, and a plurality of second AlTi layers with a content ratio in terms of atomic ratio of aluminum and titanium indicated by $Al_{1-x2}Ti_{x2}$. The coating layer includes a configuration in which the first AlTi layers and the second AlTi layers are alternately located one upon another in a direction away from the base member. The x1 is larger than the x2. The plurality of second AlTi layers include a second region in which, of adjacent two second AlTi layers, the second AlTi layer located farther away from the base member is larger in thickness than the second AlTi layer located closer to the base member.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1:
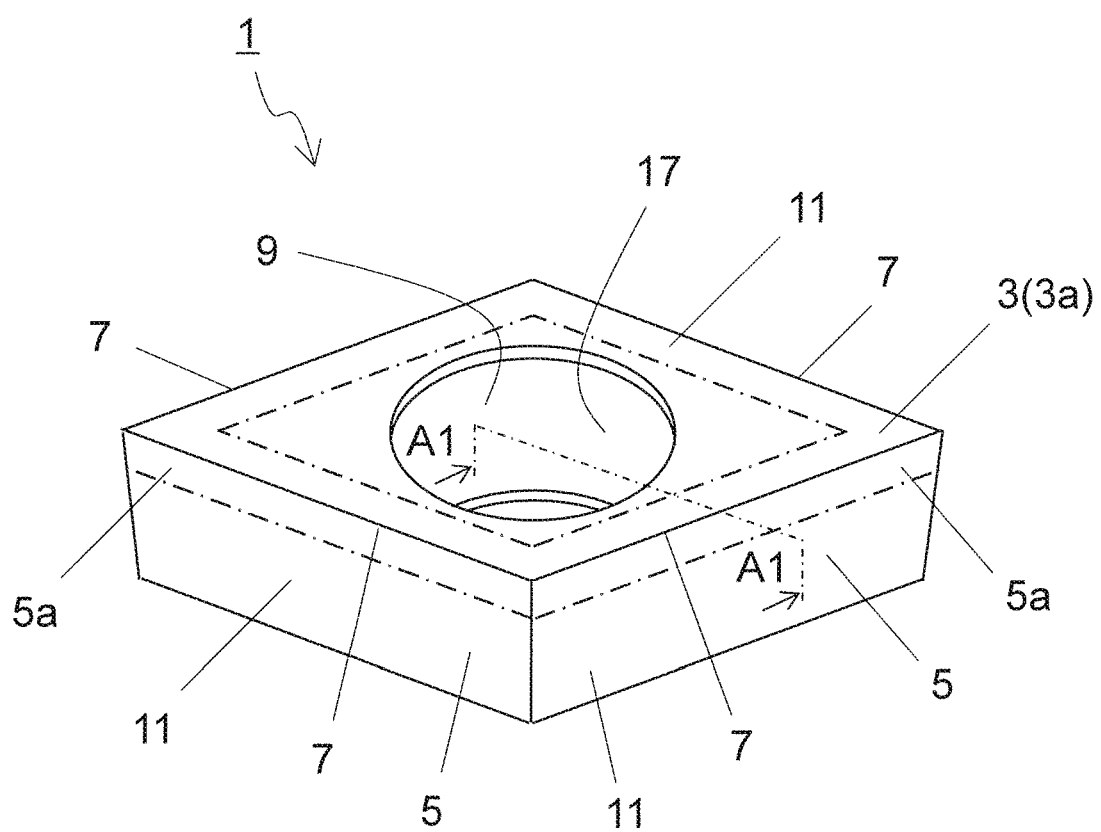
FIG. 1 is a perspective view illustrating a coated tool in a first embodiment.
Figure 2:
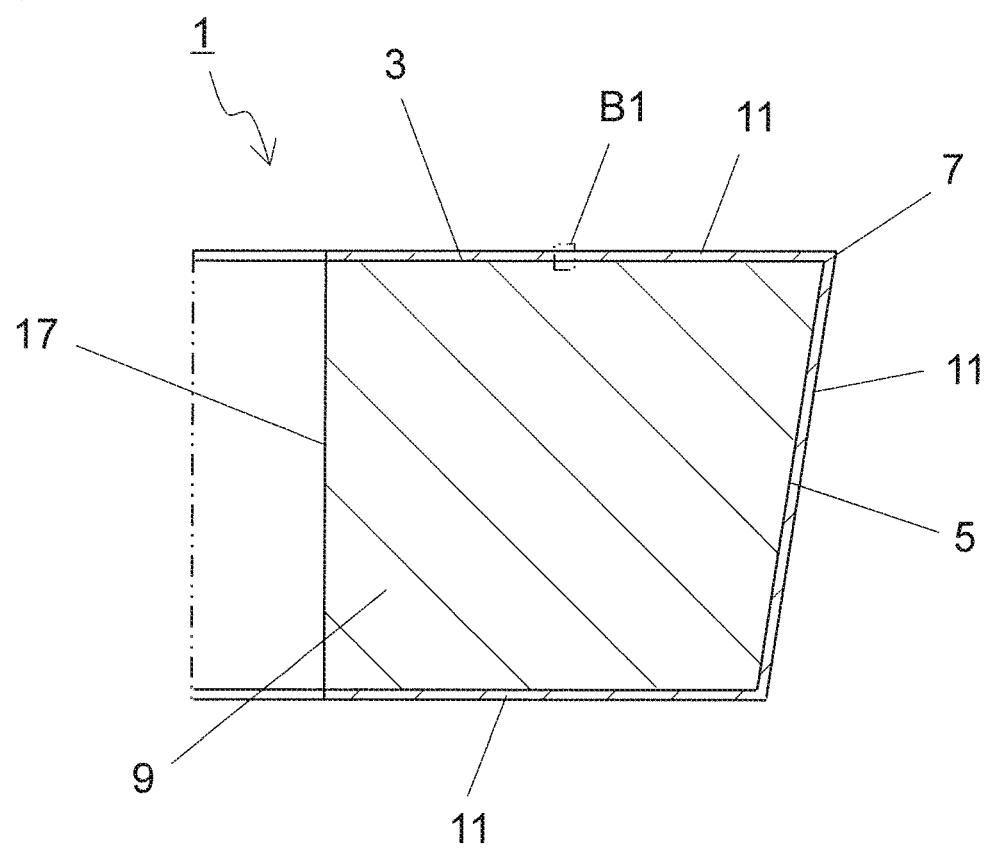
FIG. 2 is a sectional view taken along line A1-A1 in the coated tool illustrated in FIG. 1.

Coated tools in the plurality of embodiments are respectively described in detail below with reference to the drawings. For the sake of description, the drawings referred to in the following illustrate, in a simplified form, only main members necessary for describing the embodiments. The coated tool is therefore capable of including any arbitrary structural member not illustrated in the drawings referred to. Sizes of the members in each of the drawings faithfully represent neither sizes of actual structural members nor size ratios of these members.

First Embodiment

A coated tool 1 in a first embodiment has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5.

As in the coated tool 1 of the example shown in FIG. 1, the cutting edge 7 may be located on the entirety of an outer periphery of the first surface 3, or the cutting edge 7 may be located on only a part of the outer periphery of the first surface 3. For example, the cutting edge 7 may be located on only one side or a part of the first surface 3 having the quadrangular shape.

The first surface 3 may at least partially include a rake surface region 3a. In the example shown in FIG. 1, a region in the first surface 3 which is located along the cutting edge 7 serves as the rake surface region 3a. The second surface 5 may include at least partially a flank surface region 5a. In the example shown in FIG. 1, a region in the second surface 5 which is located along the cutting edge 7 serves as the flank surface region 5a. In other words, the cutting edge 7 is located on an intersecting part of the rake surface region 3a and the flank surface region 5a.

A boundary between the rake surface region 3a and other region on the first surface 3 and a boundary between the flank region and other region on the second surface 5 are indicated by a chain line in FIG. 1. FIG. 1 illustrates one embodiment in which all the ridge line where the first surface 3 intersects with the second surface 5 serves as the cutting edge 7. Therefore, FIG. 1 illustrates a ring-shaped chain line along the cutting edge 7 on the first surface 3.

A size of the coated tool 1 is not particularly limited. For example, a length of one side of the first surface 3 may be set to approximately 3-20 mm. A height from the first surface 3 to a surface (a lower surface in FIG. 1) located on an opposite side of the first surface 3 may be set to approximately 5-20 mm.

The coated tool 1 includes a base member 9 having the quadrangular plate shape and a coating layer 11 that coats a surface of the base member 9 in the example shown in FIG. 1. The coating layer 11 may cover the whole or only a part of the surface of the base member 9. Since the coating layer 11 may cover only a part of the base member 9, it may be said that the coating layer 11 is located on at least the part of the base member 9.

The coating layer 11 is located on at least the rake surface region 3a along the cutting edge 7 on the first surface 3 and the flank surface region 5a along the cutting edge 7 on the second surface 5 in the example shown in FIG. 1. FIG. 1 illustrates the embodiment in which the coating layer 11 is located on the entirety of the first surface 3 including the rake surface region 3a and the entirety of the second surface 5 including the flank surface region 5a. A thickness of the coating layer 11 is settable to, for example, approximately 0.1-10 μm. The thickness of the coating layer 11 may be constant or may be changed depending on location.

Figure 3:
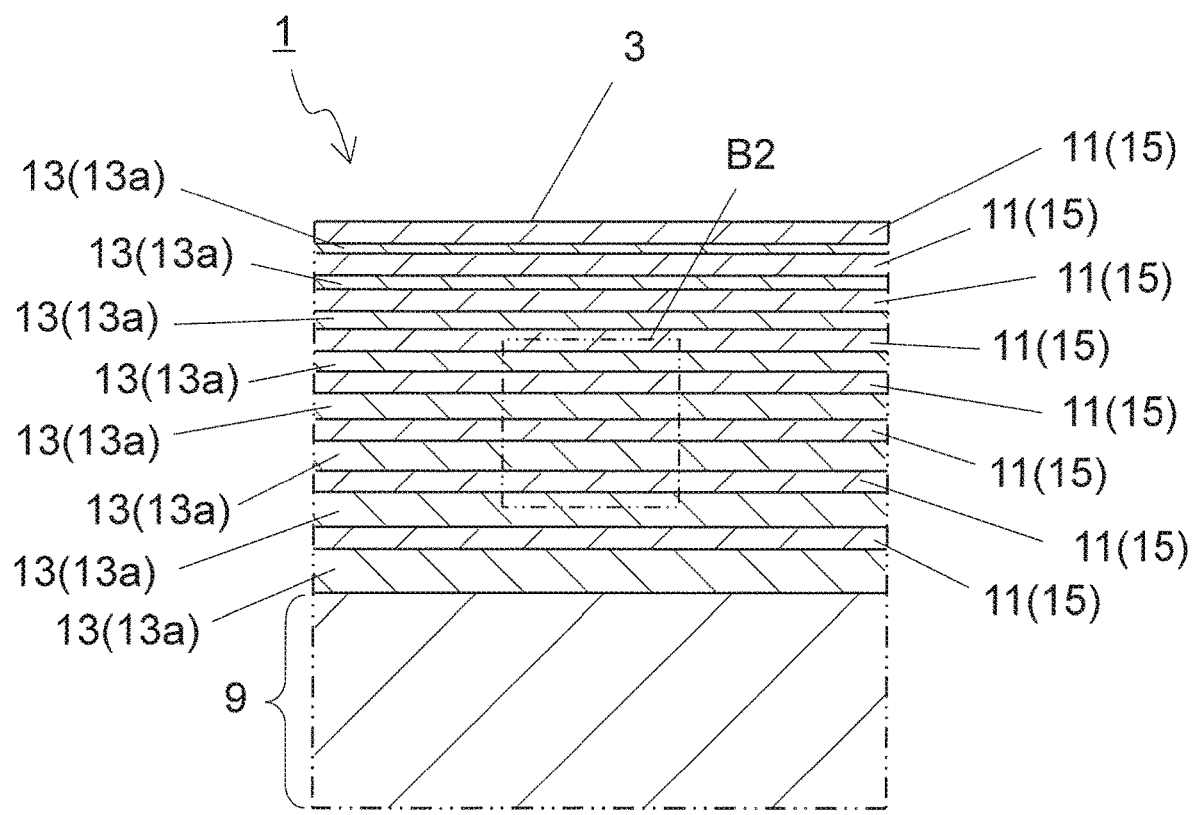
FIG. 3 is an enlarged view of a region B1 illustrated in FIG. 2.
Figure 4:
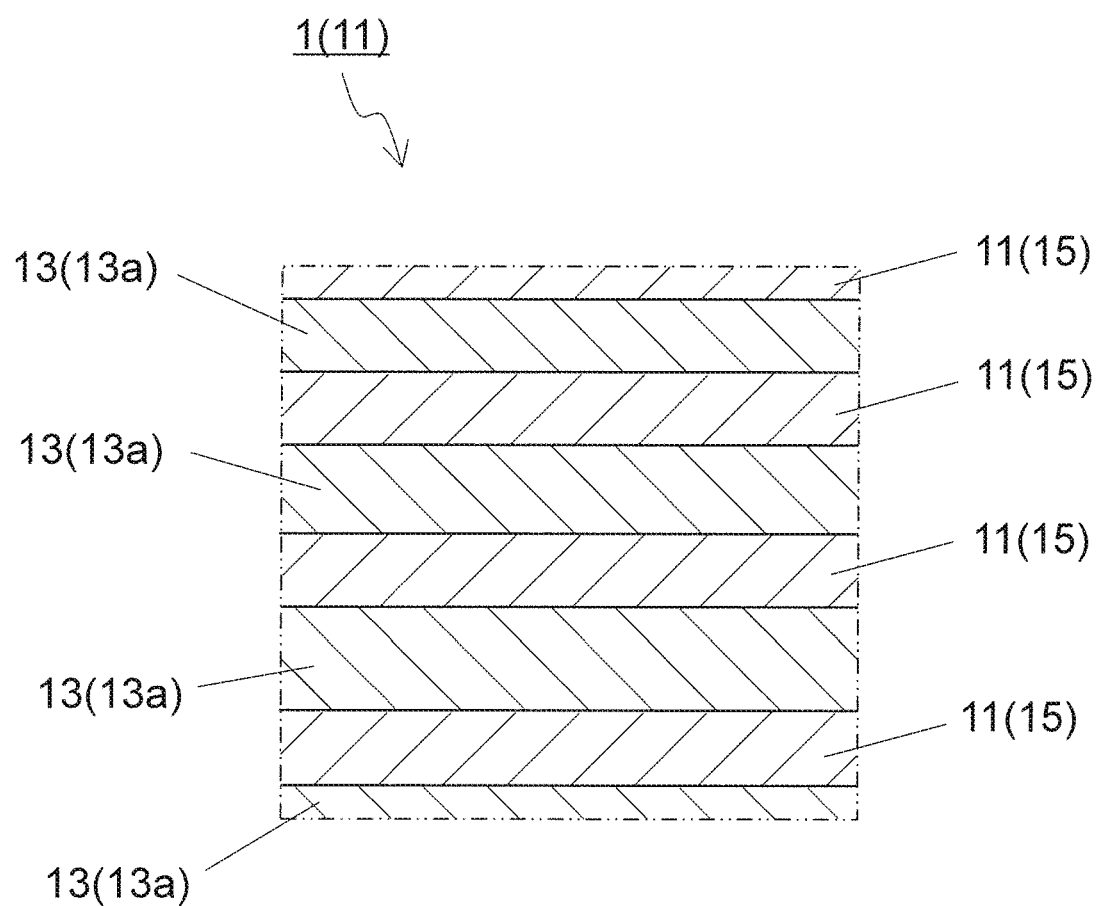
FIG. 4 is an enlarged view of a region B2 illustrated in FIG. 3.

The coating layer 11 includes a plurality of first AlTi layers 13 that include aluminum and titanium as a main component and a plurality of second AlTi layers 15 that include aluminum and titanium as a main component as illustrated in FIGS. 3 and 4. The coating layer 11 includes a configuration in which the plurality of first AlTi layers 13 and the plurality of second AlTi layers 15 are alternately located one upon another in a direction away from the base member 9. In such a case, it may be paraphrased that the coating layer 11 includes a configuration in which the plurality of first AlTi layers 13 and the plurality of second AlTi layers 15 are alternately laminated one upon another.

The content ratio in terms of atomic ratio of aluminum and titanium in the first AlTi layer 13 is represented by $Al_{1-x1}Ti_{x1}$ ($0<x1<1$). The content ratio in terms of atomic ratio of aluminum and titanium in the second AlTi layer 15 is represented by $Al_{1-x2}Ti_{x2}$ ($0<x2<1$). The values of x1 and x2 are not limited to a specific value, and are individually settable to $0.4 \leq x1 \leq 0.95$ and $0.2 \leq x2 \leq 0.7$, for example.

In the coated tool 1 of the first embodiment, x1 is larger than x2. Therefore, the content ratio of Ti in the first AlTi layer 13 is higher than that in the second AlTi layer 15, and the first AlTi layer 13 is superior in joinability to the second AlTi layer 15. In addition, the content ratio of Al in the second AlTi layer 15 is higher than that in the first AlTi layer 13, and the second AlTi layer 15 is superior in wear resistance to the first AlTi layer 13.

When x1 is larger than 0.5 and x2 is smaller than 0.5, the joinability of the first AlTi layer 13 is particularly excellent, and the wear resistance of the second AlTi layer 15 is particularly excellent.

The laminate structure of the coating layer 11 is evaluable by a cross-sectional measurement using Scanning Electron Microscopy (SEM) or Transmission Electron Microscopy (TEM).

The first AlTi layer 13 and the second AlTi layer 15 may be composed of only aluminum and titanium, respectively, and may include a metal component, such as Si, Nb, Hf, V, Ta, Mo, Zr, Cr, and W, in addition to aluminum and titanium.

However, since the first AlTi layer 13 and the second AlTi layer 15 include aluminum and titanium as a main component, the content ratios of aluminum and titanium are higher than that of the metal component. The term "content ratio" means a content ratio in terms of atomic ratio.

The first AlTi layer 13 and the second AlTi layer 15 may be composed only of a metal component including aluminum and titanium, or may be composed of a nitride, carbide, or carbonitride of a metal component including aluminum and titanium.

Compositions of the first AlTi layer 13 and the second AlTi layer 15 are measurable using energy dispersive X-ray spectroscopy (EDS) or X-ray photoelectron spectroscopy (XPS).

The number of the first AlTi layers 13 and the number of the second AlTi layers 15 are not limited to a specific value. The number of the first AlTi layers 13 and the number of the second AlTi layers 15 may be individually two or more, and may be set to 2 to 500, for example.

The thickness of the first AlTi layer 13 is not limited to a specific value. For example, the thickness of each of the plurality of first AlTi layers 13 may be set to 5 nm to 100 nm. The plurality of first AlTi layers 13 in the first embodiment each include a thickness that is not constant, and include a region in which, of adjacent two first AlTi layers 13 of the plurality of first AlTi layers 13, the first AlTi layer located farther away from the base member 9 is smaller in thickness than the first AlTi layer located closer to the base member 9. A region satisfying the above-described thickness relationship in adjacent two of the first AlTi layers 13 among the plurality of first AlTi layers 13 is referred to as a first region 13a. In other words, the first region 13a can be said to be a region in which, of adjacent two first AlTi layers 13 of the plurality of first AlTi layers 13, the first AlTi layer located closer to the base member 9 is larger in thickness than the first AlTi layer located farther away from the base member 9.

In a case where the coating layer 11 includes the first region 13a, the ratio of the second AlTi layer 15 to the first AlTi layer 13 is high on the side of the first region 13a away from the base member 9, and the ratio of the first AlTi layer 13 to the second AlTi layer 15 is high on the side of the first region 13a close to the base member 9.

Since the ratio of the first AlTi layer 13 excellent in joinability is high on the side of the first region 13a close to the base member 9, the joinability of the coating layer 11 is high. Since the ratio of the second AlTi layer 15 excellent in wear resistance is high on the side of the first region 13a away from the base member 9, the wear resistance of the coating layer 11 is high. Therefore, the coated tool 1 of the first embodiment is excellent in both wear resistance and joinability.

The thickness may be smaller as going farther away from the base member in all of the plurality of first AlTi layers 13, and the thickness may be smaller as going farther away from the base member in only a part of the plurality of first AlTi layers 13. In other words, all of the plurality of first AlTi layers 13 may be included in the first region 13a, or only a part of the plurality of first AlTi layers 13 may be included in the first region 13a.

In the example shown in FIG. 3, since the thickness is smaller as going farther away from the base member in all of the plurality of first AlTi layers 13, it can be said that all of the plurality of first AlTi layers 13 are included in the first region 13a. In this case, the joinability and wear resistance of the coating layer 11 are further enhanced.

In the first region 13a, the thickness of the first AlTi layer 13 is smaller as going farther away from the base member 9. At this time, change in the thickness of the plurality of first AlTi layers 13 included in the first region 13a is not particularly limited, and the change amount may be or may not be constant.

Figure 5:
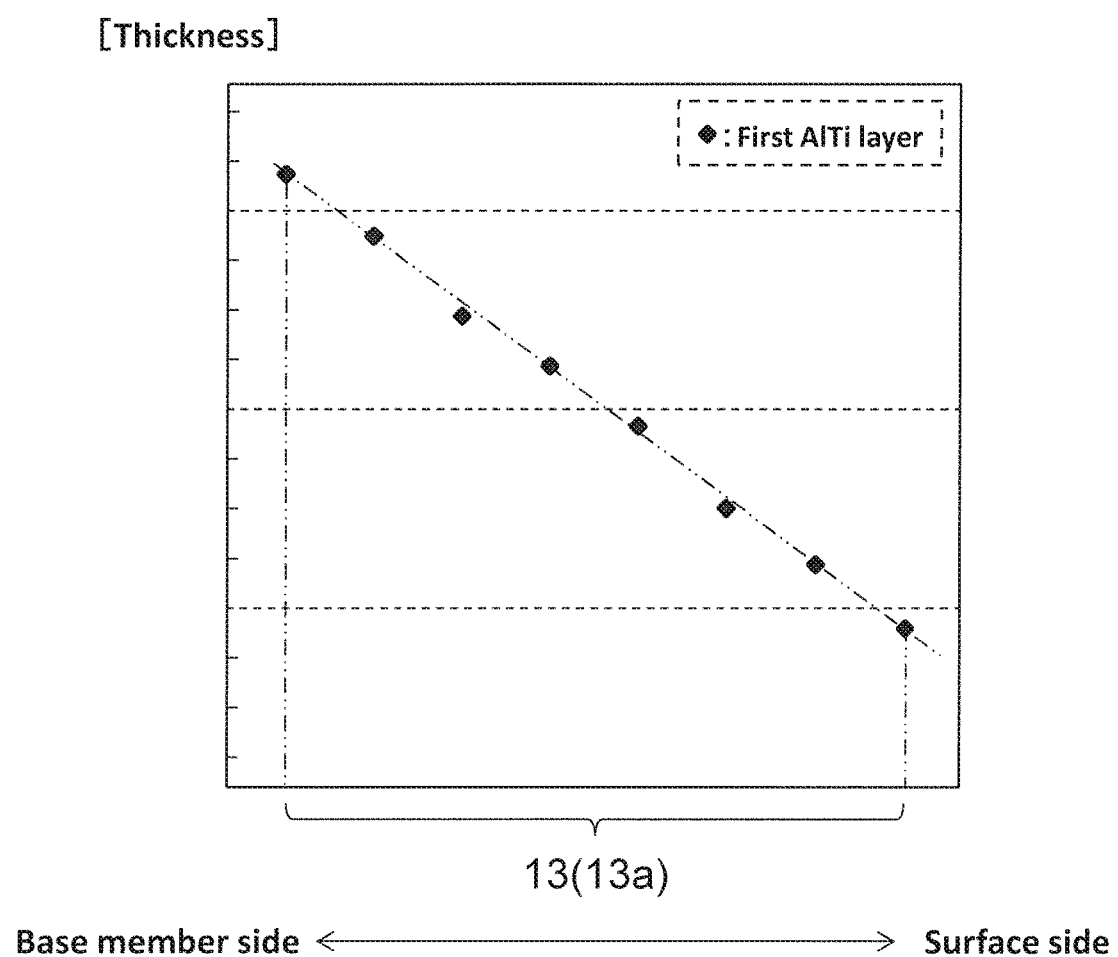
FIG. 5 is a graph indicating the thickness of a first AlTi layer in the coated tool illustrated in FIG. 1.

In the first region 13a of the example shown in FIG. 5, the change amount in thickness of the plurality of first AlTi layers 13 is constant. That is, when three or more of the first AlTi layers 13 are in the first region 13a, the difference in thickness between adjacent two first AlTi layers 13 is equal to the difference in thickness between different adjacent two first AlTi layers 13.

When the thicknesses of the plurality of first AlTi layers 13 change as described above, it is possible to avoid a rapid change in the thickness of the first AlTi layer 13, and stress is less likely to concentrate at a part of the coating layer 11. Therefore, the durability of the coating layer 11 is high. The phrase "the change amount in the thickness of the first AlTi layer 13 in the first region 13a is constant" means that the thickness of the first AlTi layer 13 included in the first region 13a is roughly located on a straight line as illustrated in FIG. 5.

The thickness of the first AlTi layer 13 included in the first region 13a needs not be strictly located on the straight line. If the thickness of the first AlTi layer 13 located closest to the base member 9 among the first AlTi layers 13 included in the first region 13a is linearly connected to the thickness of the first AlTi layer 13 located farthest away from the base member 9 among the first AlTi layers 13 included in the first region 13a, the thicknesses of the individual first AlTi layers 13 may include a value in a range of 90 to 110% relative to a strict value indicated by the straight line.

Figure 6:
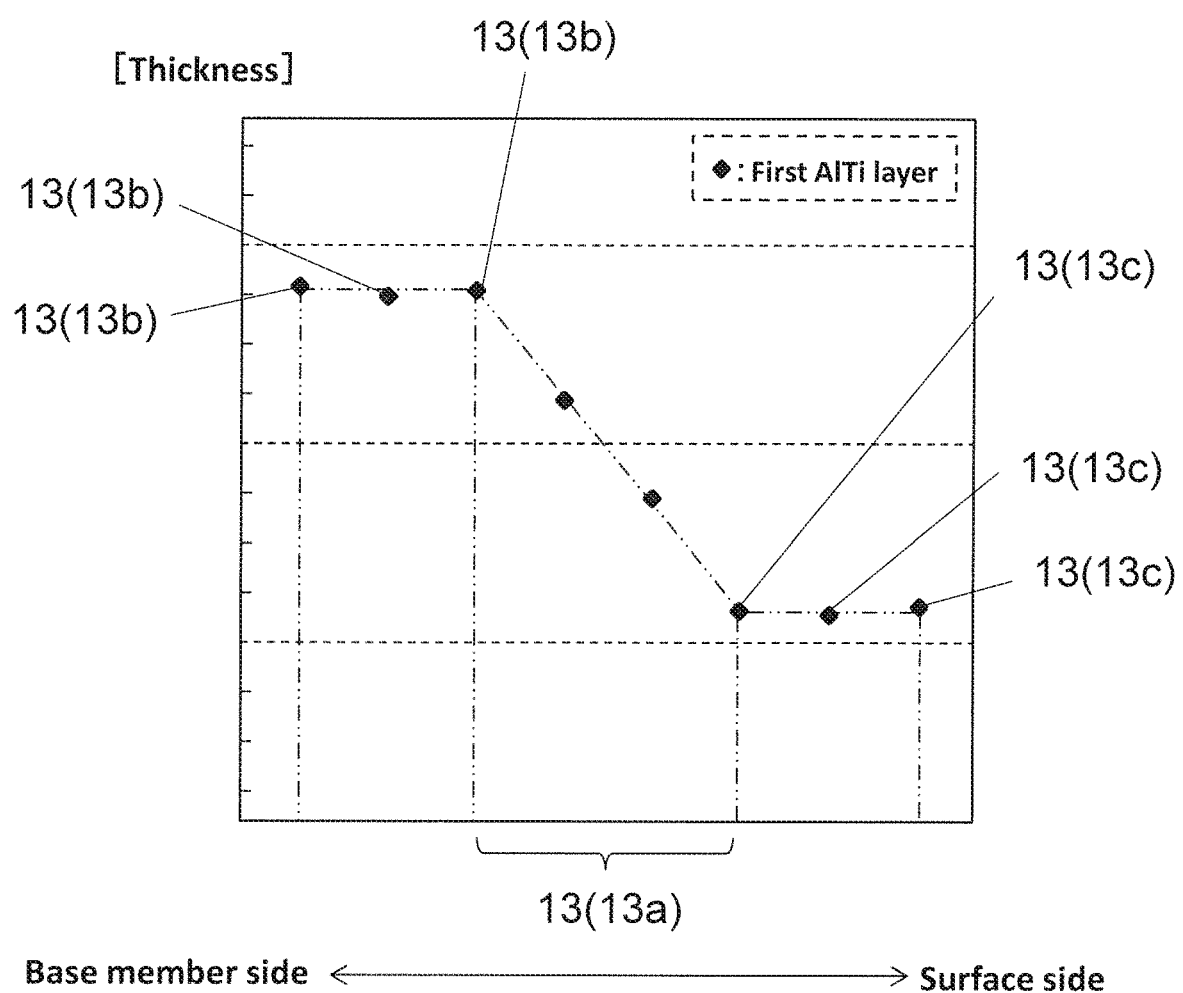
FIG. 6 is a graph indicating the thickness of a first AlTi layer in a first modification of the coated tool illustrated in FIG. 5.

In the modification shown in FIG. 6, only a part of the plurality of first AlTi layers 13 is included in the first region 13a. Specifically, among the plurality of first AlTi layers 13 constituting the coating layer 11, the thickness of a part of first AlTi layers 13b located close to the base member 9 is constant. As described above, when the thickness of the first AlTi layer 13b located closer to the base member 9 than the first region 13a is constant, stress is less likely to concentrate in a part of the first AlTi layer 13b including the constant thickness. Therefore, the durability of the coating layer 11 is high.

In the modification shown in FIG. 6, among the plurality of first AlTi layers 13 constituting the coating layer 11, the thickness of a part of first AlTi layers 13c located away from the base member 9 is constant. As described above, when the thickness of the first AlTi layer 13c located farther away from the base member 9 than the first region 13a is constant, stress is less likely to concentrate in a part of the first AlTi layer 13c including the constant thickness. Therefore, the durability of the coating layer 11 is high.

Note that the phrase "the thickness of the first AlTi layer 13 is constant" does not require exactly the same thickness. The thickness is regarded as constant if the thickness of the thinnest first AlTi layer 13 among the plurality of target first AlTi layers 13 is 95% or more with respect to the thickness of the thickest first AlTi layer 13.

For example, as in the modification shown in FIG. 6, if adjacent two first AlTi layers 13 of the first AlTi layers 13 are equal in thickness to each other, or of the adjacent two first AlTi layers, the first AlTi layer farther away from the base member 9 is smaller in thickness than the first AlTi layer closer to the base member 9, the coating layer 11 is particularly excellent in both the wear resistance and joinability.

This is because, over the entire coating layer 11, the ratio of the second AlTi layer 15 excellent in wear resistance is high on the side away from the base member 9, and the ratio of the first AlTi layer 13 excellent in joinability is high on the side close to the base member 9.

Figure 7:
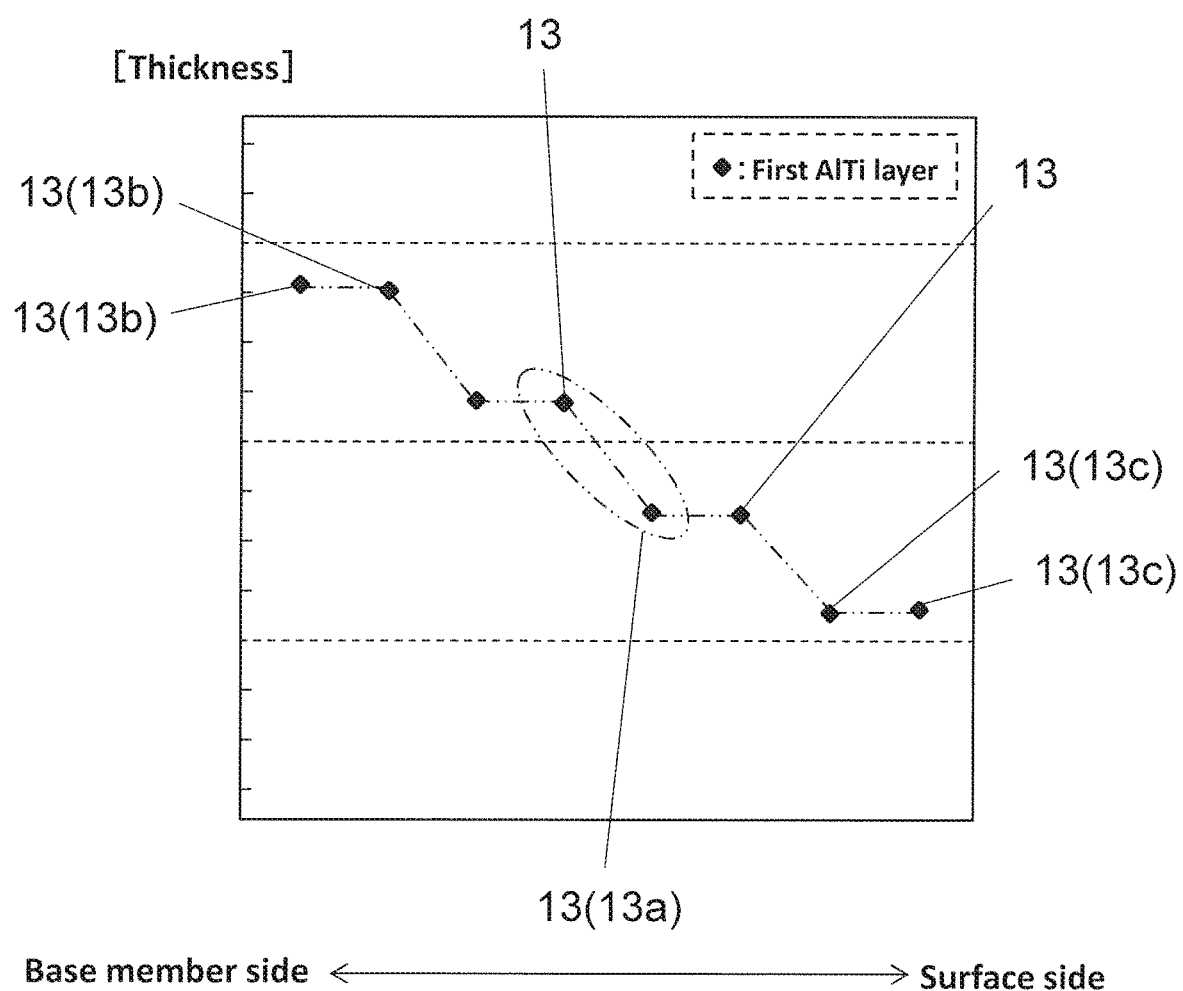
FIG. 7 is a graph indicating the thickness of a first AlTi layer in a second modification of the coated tool illustrated in FIG. 5.

In the modification shown in FIG. 7, the plurality of first AlTi layers 13 constituting the coating layer 11 are divided into a plurality of sections in the lamination direction. The thickness of the first AlTi layer 13 included in each section is constant, and the farther a section is located away from the base member 9, the smaller the thickness of the included first AlTi layer 13 is. In the modification shown in FIG. 7, the first region 13a is constituted by a pair of first AlTi layers 13 located at a boundary between adjacent sections.

When the plurality of first AlTi layers 13 constituting the coating layer 11 include the above-described configuration, the thickness of the first AlTi layer 13 changes stepwise, and it is hence easy to adjust the thickness of the first AlTi layer 13 when the first AlTi layer 13 is formed. Therefore, it is possible to form the coating layer 11 excellent in joinability and wear resistance without relying on a complicated step.

The thickness of the second AlTi layer 15 is not limited to a specific value, but may be set to 5 nm to 100 nm, for example. The thickness of each of the plurality of second AlTi layers 15 may be constant, or the thickness of some of the second AlTi layers 15 may be different from one another.

When the thickness of the first AlTi layer 13 is larger than the thickness of the second AlTi layer 15 on the side closer to the base member 9 of the coating layer 11, the joinability of the coating layer 11 is further enhanced. Specifically, for example, for the first AlTi layer 13 and the second AlTi layer 15 located closer to the base member 9 than the center of the coating layer 11 in the lamination direction, if the average value of the thickness of the first AlTi layer 13 is greater than that of the second AlTi layer 15, the joinability of the coating layer 11 is further enhanced.

When the thickness of the second AlTi layer 15 is larger than the thickness of the first AlTi layer 13 on the side away from the base member 9 of the coating layer 11, the wear resistance of the coating layer 11 is further enhanced. Specifically, for example, for the first AlTi layer 13 and the second AlTi layer 15 located farther away from the base member 9 than the center of the coating layer 11 in the lamination direction, if the average value of the thickness of the second AlTi layer 15 is greater than that of the first AlTi layer 13, the wear resistance of the coating layer 11 is further enhanced.

The coating layer 11 may be directly joined to the base member 9, but in order to improve the joinability between the base member 9 and the coating layer 11, another layer such as an underlayer (not illustrated) thicker than the first AlTi layer 13 and the second AlTi layer 15 constituting the coating layer 11 may be located between the base member 9 and the coating layer 11.

Although the coated tool 1 in the example shown in FIG. 1 has the quadrangular plate shape, the shape of the coated tool 1 is not limited thereto. There is no problem even if the first surface 3 does not have the quadrangular shape but may have, for example, a hexagonal shape or circular shape.

The coated tool 1 may include a through hole 17 as illustrated in FIG. 1. The through hole 17 is located from the first surface 3 to the surface (the lower surface in FIG. 1) located on the opposite side of the first surface 3 in the example shown in FIG. 1, and the through hole 17 opens into these surfaces. The through hole 17 may be used for attaching a screw or clamping member when holding the coated tool 1 onto a holder. There is no problem even if the through hole 17 opens into regions located on opposite sides in the second surface 5.

Examples of material of the base member 9 include inorganic materials, such as cemented carbide, cermet and ceramics. Examples of composition of cemented carbide include WC(tungsten carbide)-Co, WC—TiC(titanium carbide)-Co and WC—TiC—TaC(tantalum carbide)-Co.

Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base member 9 is not limited to these materials.

The coating layer 11 may be located on the base member 9 by using, for example, physical vapor deposition (PVD) method. In cases where the coating layer 11 is deposited with the base member 9 held on an inner peripheral surface of the through hole 17 by using the above vapor deposition method, the coating layer 11 can be located so as to cover the entirety of the surface of the base member 9 except for the inner peripheral surface of the through hole 17.

Examples of the physical deposition method includes ion plating method and sputtering method. As one example of the deposition with the ion plating method, the coating layer 11 of the first embodiment may be deposited with the following method.

In a first procedure, a metal target independently including aluminum and titanium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The first AlTi layer 13 may be formed through the above procedure.

In a second procedure, a metal target independently including aluminum and titanium, a composite alloy target or a sintered body target is prepared. At this time, a target higher in content ratio of aluminum than the target prepared in the first procedure is prepared. The above target serving as a metal source is vaporized and ionized by an arc discharge and a glow discharge. The ionized target is reacted with nitrogen gas as a nitrogen source, and methane gas or acetylene gas as a carbon source, and is deposited on the surface of the base member 9. The second AlTi layer 15 may be formed through the above procedure.

The coating layer 11 including a configuration in which the plurality of first AlTi layers 13 and the plurality of second AlTi layers 15 are alternately located one upon another in a direction away from the base member 9 may be formed by alternately repeating the first procedure and the second procedure. There is no problem even if the first procedure is carried out after the second procedure.

When repeating the first procedure, for example, the thicknesses of the plurality of first AlTi layers 13 can be changed by changing the current value during discharge such as arc discharge and glow discharge. Specifically, when repeating the first procedure, by reducing the current value, the first region 13a in which, of adjacent two first AlTi layers 13, the first AlTi layer 13 located farther away from the base member 9 is smaller in thickness than the first AlTi layers 13 located closer to the base member 9 may be manufactured.

It is possible to ensure that the first AlTi layer 13 located farther away from the base member 9 includes a smaller thickness by, for example, gradually reducing the current value during discharge from the first execution of the first procedure to the final execution of the first procedure when repeating the first procedure.

Second Embodiment

The coated tool 1 in the second embodiment is described below with reference to the drawings. However, the coated tool 1 of the second embodiment differs from the coated tool 1 of the first embodiment in the following points, which are mainly described in detail below. Descriptions of configurations similar to those in the coated tool 1 of the first embodiment may be omitted here.

Figure 8:
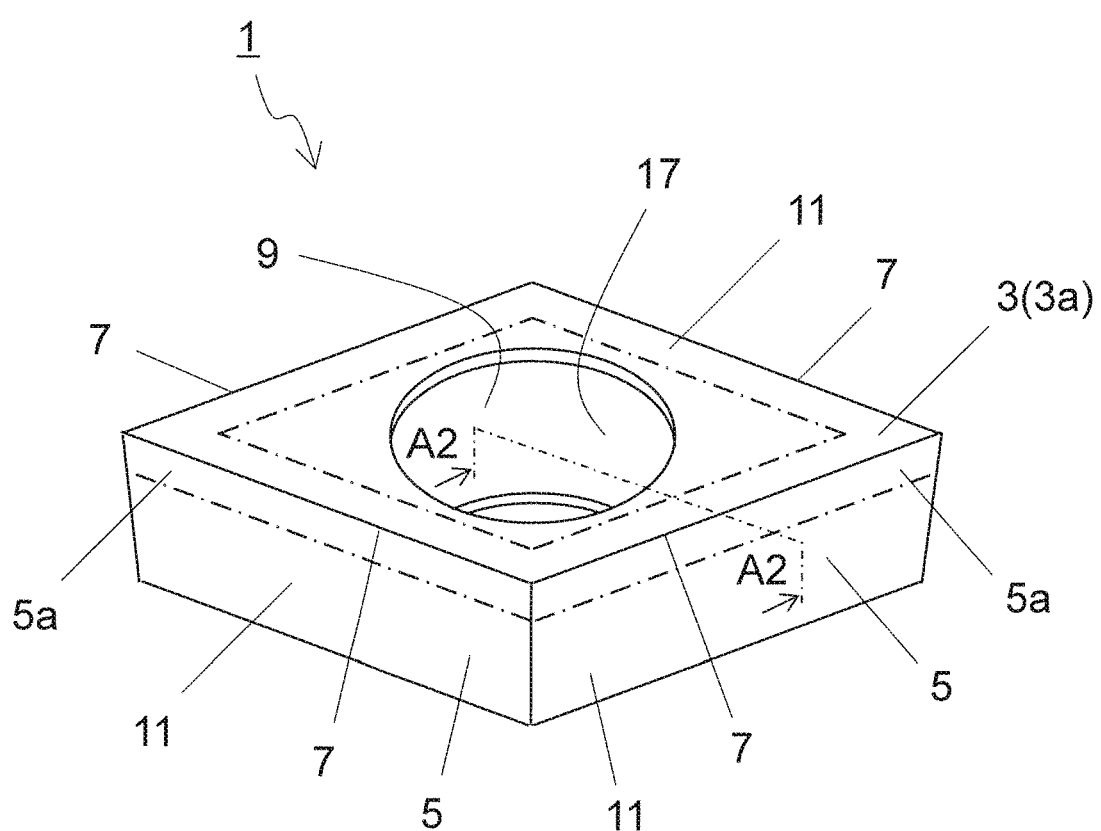
FIG. 8 is a perspective view illustrating a coated tool in a second embodiment.
Figure 9:
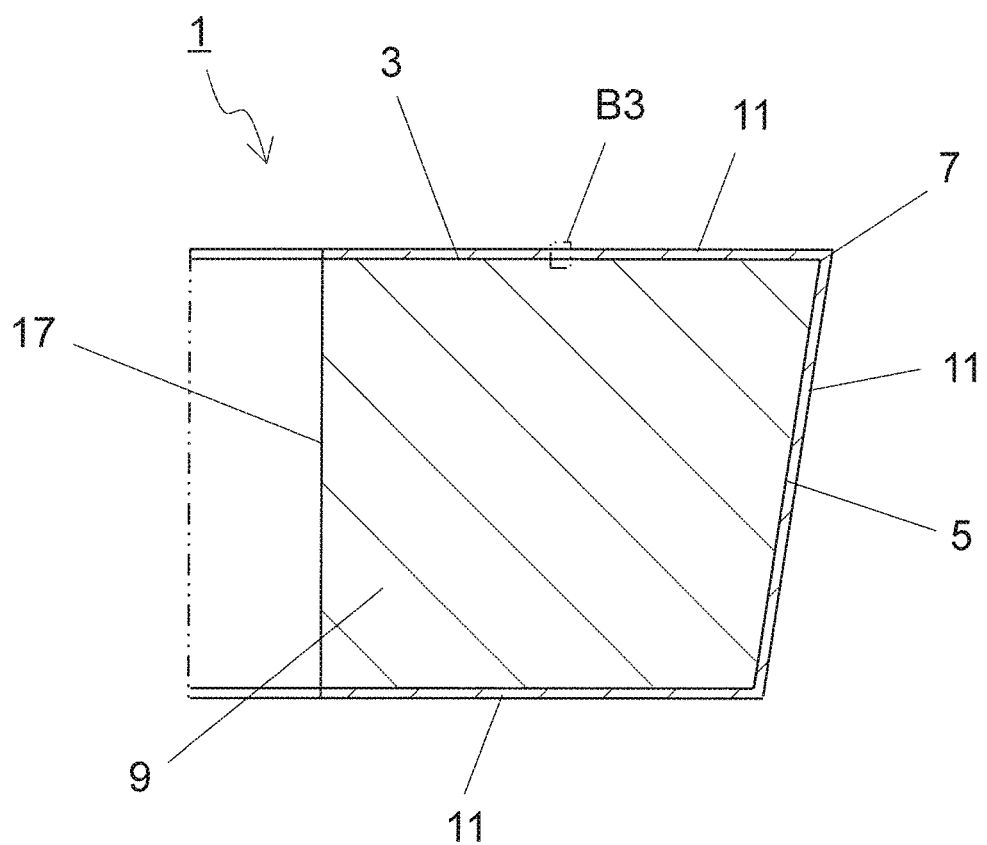
FIG. 9 is a sectional view taken along line A2-A2 in the coated tool illustrated in FIG. 8.

The coated tool 1 in the second embodiment has a quadrangular plate shape and includes the first surface 3 (upper surface in FIG. 8) having a quadrangular shape, the second surface 5 (side surface in FIG. 8), and the cutting edge 7 located on at least a part of a ridge line where the first surface 3 intersects with the second surface 5. The coated tool 1 includes a base member 9 having the quadrangular plate shape and a coating layer 11 that coats a surface of the base member 9 in the example shown in FIG. 8, an in the example shown in FIG. 1. The coating layer 11 may cover the whole or only a part of the surface of the base member 9.

Figure 10:
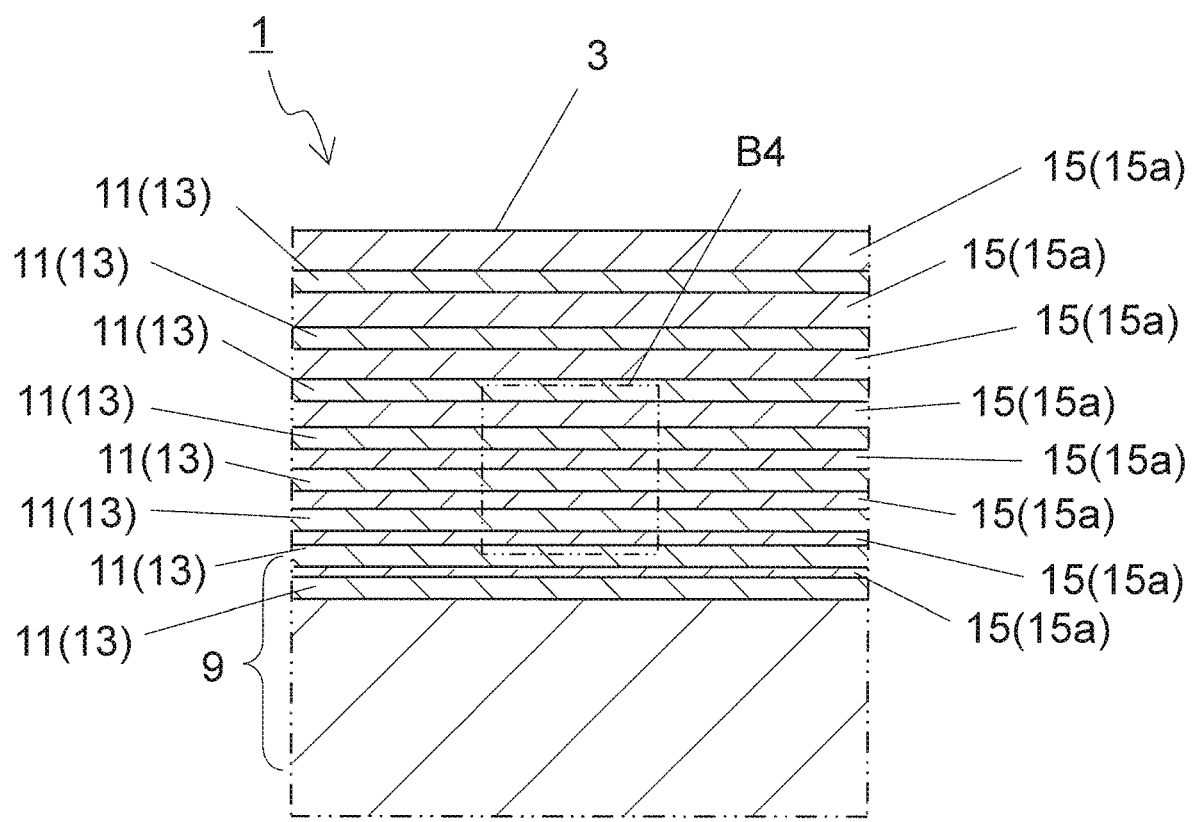
FIG. 10 is an enlarged view of a region B3 illustrated in FIG. 9.
Figure 11:
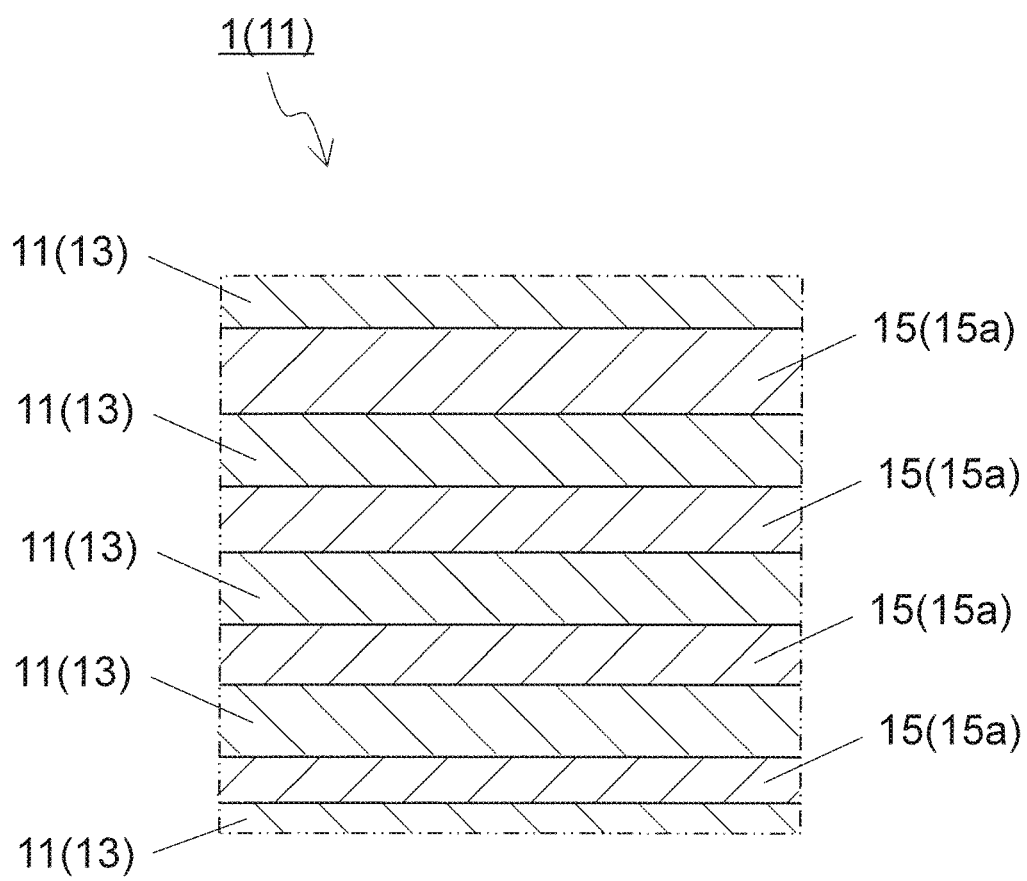
FIG. 11 is an enlarged view of a region B4 illustrated in FIG. 10.

The coating layer 11 includes the plurality of first AlTi layers 13 that include aluminum and titanium as a main component and the plurality of second AlTi layers 15 that include aluminum and titanium as a main component as illustrated in FIGS. 10 and 11. The coating layer 11 includes a configuration in which the plurality of first AlTi layers 13 and the plurality of second AlTi layers 15 are alternately located one upon another in a direction away from the base member 9.

The thickness of the second AlTi layer 15 is not limited to a specific value. For example, the thickness of each of the plurality of second AlTi layers 15 may be set to 5 nm to 100 nm. The plurality of second AlTi layers 15 in the second embodiment each include a thickness that is not constant, and may include a second region 15*a* in which, of adjacent two second AlTi layers, the second AlTi layer 15 located farther away from the base member 9 is larger in thickness than the second AlTi layer 15 located closer to the base member 9.

In a case where the coating layer 11 includes the second region 15*a*, the ratio of the second AlTi layer 15 to the first AlTi layer 13 is high on the side of the second region 15*a* away from the base member 9, and the ratio of the first AlTi layer 13 to the second AlTi layer 15 is high on the side of the second region 15*a* close to the base member 9.

Since the ratio of the first AlTi layer 13 excellent in joinability is high on the side of the second region 15*a* close to the base member 9, the joinability of the coating layer 11 is high. Since the ratio of the second AlTi layer 15 excellent in wear resistance is high on the side of the second region 15*a* away from the base member 9, the wear resistance of the coating layer 11 is high. Therefore, the coated tool 1 of the second embodiment is excellent in both wear resistance and joinability, similarly to the coated tool 1 of the first embodiment.

All of the plurality of second AlTi layers 15 may be included in the second region 15*a*, or only a part of the plurality of second AlTi layers 15 may be included in the second region 15*a*. In the example shown in FIG. 10, all of the plurality of second AlTi layers 15 are included in the second region 15*a*. In this case, the joinability and wear resistance of the coating layer 11 are further enhanced.

In the second region 15*a*, the thickness of the second AlTi layer 15 is larger as going farther away from the base member 9. At this time, change in the thickness of the plurality of second AlTi layers 15 included in the second region 15*a* is not particularly limited, and the change amount may be or may not be constant.

In the second region 15*a* of the example shown in FIGS. 10 and 11, the change amount in thickness of the plurality of second AlTi layers 15 is constant. That is, when three or more of the second AlTi layers 15 are in the second region 15*a*, the difference in thickness between adjacent two second AlTi layers 15 is equal to the difference in thickness between different adjacent two second AlTi layers 15.

Figure 12:
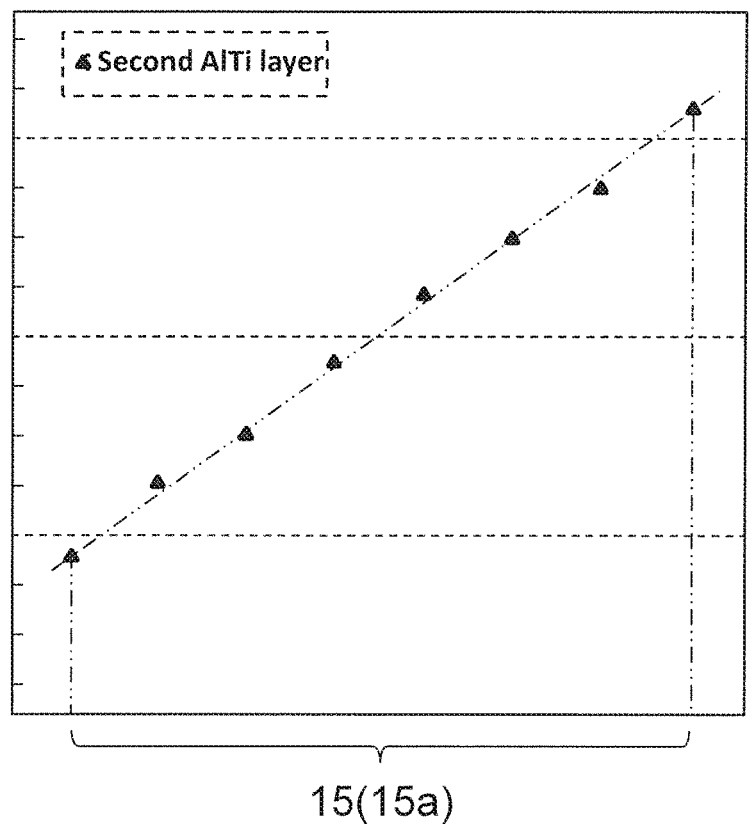
FIG. 12 is a graph indicating the thickness of a second AlTi layer in the coated tool illustrated in FIG. 8.

When the thicknesses of the plurality of second AlTi layers 15 change as described above, it is possible to avoid a rapid change in the thickness of the second AlTi layers 15, and stress is less likely to concentrate at a part of the coating layer 11. Therefore, the durability of the coating layer 11 is high. The phrase "the change amount in the thickness of the second AlTi layer 15 in the second region 15*a* is constant" means that the thickness of the second AlTi layer 15 included in the second region 15*a* is roughly located on a straight line as illustrated in FIG. 12.

The thickness of the second AlTi layer 15 included in the second region 15*a* needs not be strictly located on the straight line. If the thickness of the second AlTi layer 15 located closest to the base member 9 among the second AlTi layers 15 included in the second region 15*a* is linearly connected to the thickness of the second AlTi layer 15 located farthest away from the base member 9 among the second AlTi layers 15 included in the second region 15*a*, the thicknesses of the individual second AlTi layers 15 may include a value in a range of 90-110% relative to a strict value indicated by the straight line.

Figure 13:
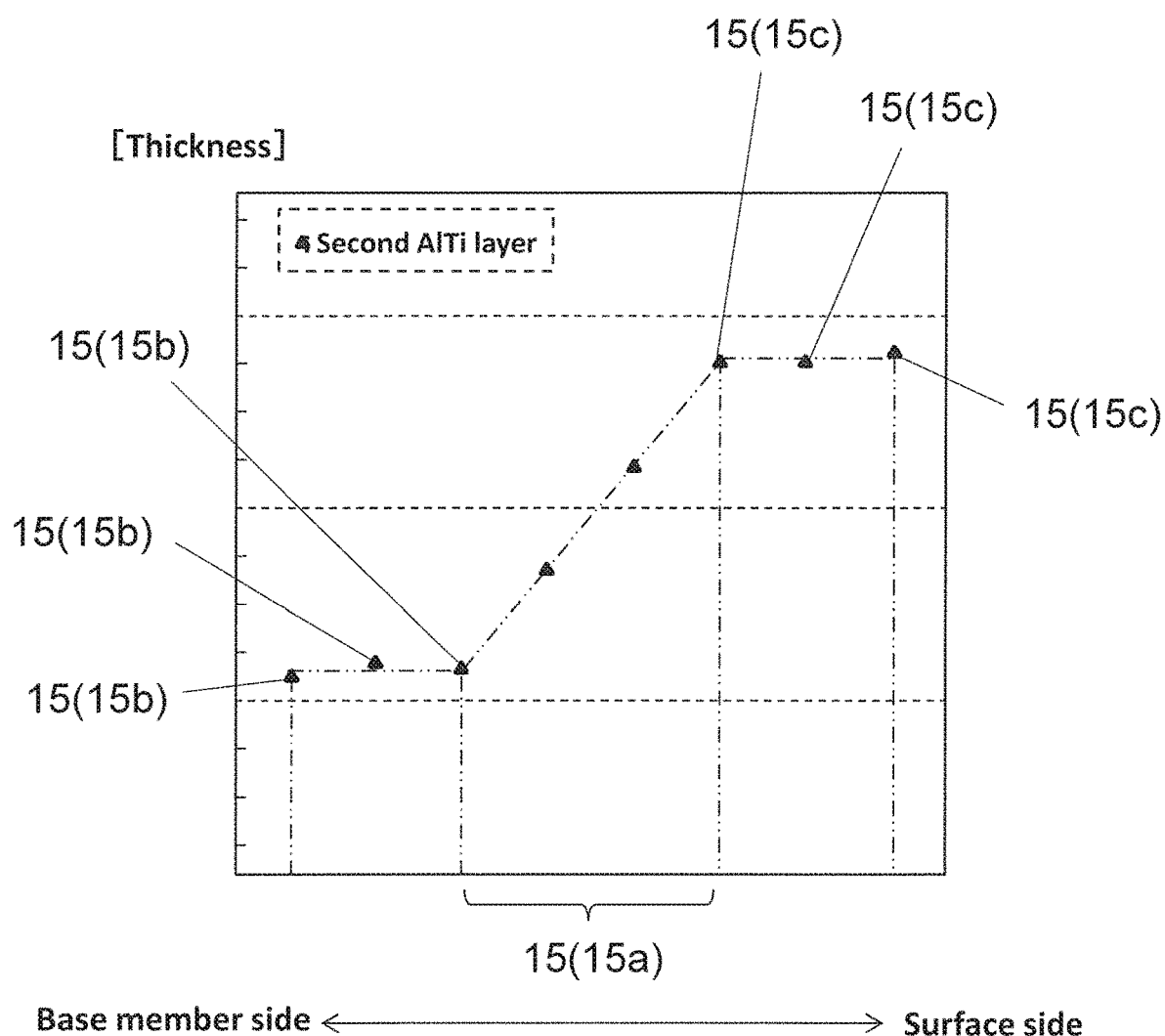
FIG. 13 is a graph indicating the thickness of a second AlTi layer in a third modification of the coated tool illustrated in FIG. 12.

In the modification shown in FIG. 13, only a part of the plurality of second AlTi layers 15 is included in the second region 15*a*. Specifically, among the plurality of second AlTi layers 15 constituting the coating layer 11, the thickness of a part of second AlTi layers 15*b* located close to the base member 9 is constant. As described above, when the thickness of the second AlTi layer 15*b* located closer to the base member 9 than the second region 15*a* is constant, stress is less likely to concentrate in a part of the second AlTi layer 15*b* including the constant thickness. Therefore, the durability of the coating layer 11 is high.

In the modification shown in FIG. 13, among the plurality of second AlTi layers 15 constituting the coating layer 11, the thickness of a part of second AlTi layers 15*c* located away from the base member 9 is constant. As described above, when the thickness of the second AlTi layer 15*c* located farther away from the base member 9 than the second region 15*a* is constant, stress is less likely to concentrate in a part of the second AlTi layer 15*c* including the constant thickness. Therefore, the durability of the coating layer 11 is high.

Note that the phrase "the thickness of the second AlTi layer 15 is constant" does not require exactly the same thickness. The thickness is regarded as constant if the thickness of the thinnest second AlTi layer 15 among the plurality of target second AlTi layers 15 is 95% or more with respect to the thickness of the thickest second AlTi layer 15.

For example, as in the modification shown in FIG. 13, if adjacent two second AlTi layers 15 of the second AlTi layers 15 are equal in thickness to each other, or of the adjacent two second AlTi layers 15, the second AlTi layer 15 located farther away from the base member 9 is larger than the second AlTi layer 15 located closer to the base member 9, the coating layer 11 is particularly excellent in both the wear resistance and joinability.

This is because, over the entire coating layer 11, the ratio of the second AlTi layer 15 excellent in wear resistance is high on the side away from the base member 9, and the ratio of the first AlTi layer 13 excellent in joinability is high on the side close to the base member 9.

Figure 14:
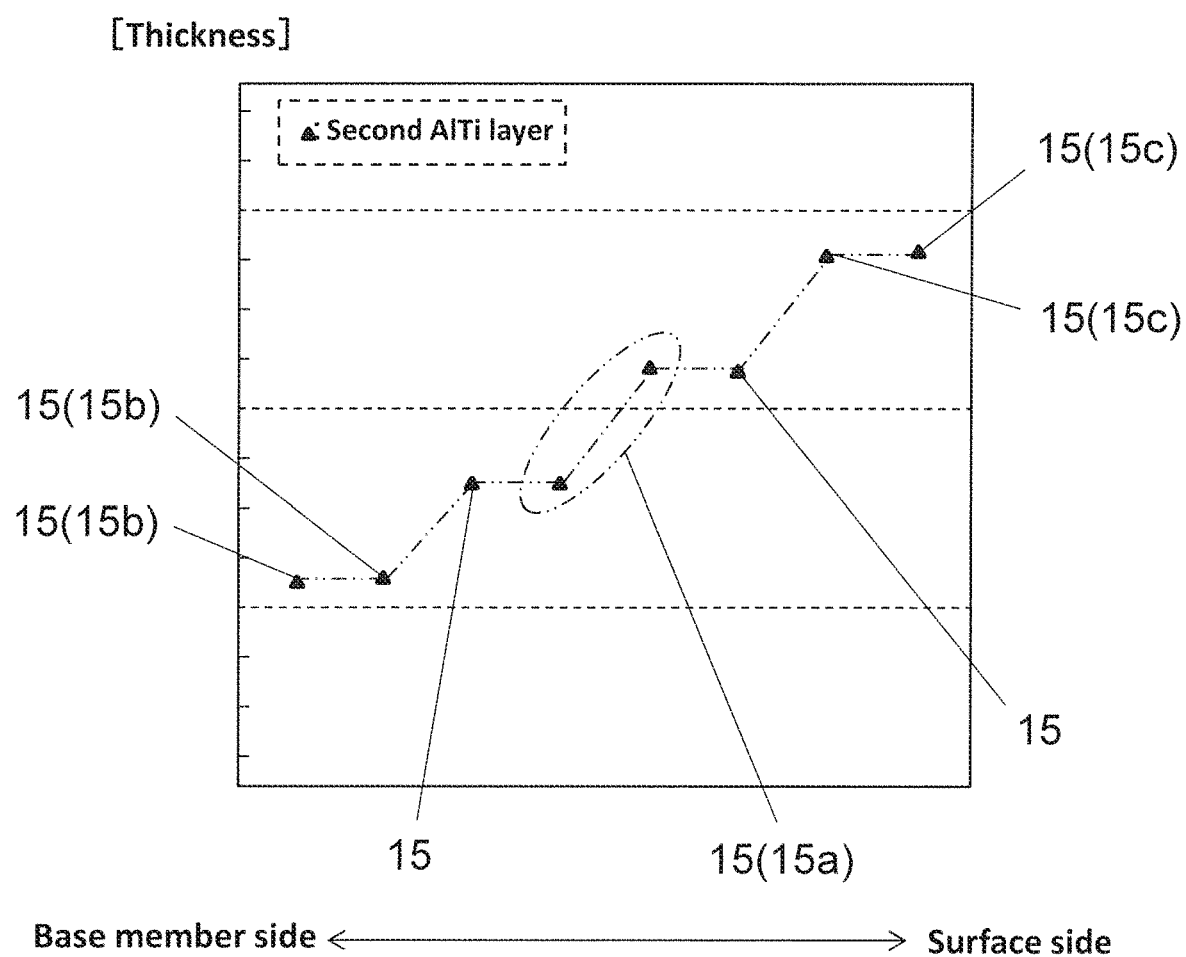
FIG. 14 is a graph indicating the thickness of a second AlTi layer in a fourth modification of the coated tool illustrated in FIG. 12.

In the modification shown in FIG. 14, the plurality of second AlTi layers 15 constituting the coating layer 11 are divided into a plurality of sections in the lamination direction. The thickness of the second AlTi layer 15 included in each section is constant, and the farther a section is located away from the base member 9, the larger the thickness of the included second AlTi layer 15 is. In the modification shown in FIG. 14, the second region 15a is constituted by a pair of second AlTi layers 15 located at a boundary between adjacent sections.

When the plurality of second AlTi layers 15 constituting the coating layer 11 include the above-described configuration, the thickness of the second AlTi layer 15 changes stepwise, and it is hence easy to adjust the thickness of the second AlTi layer 15 when the second AlTi layer 15 is formed. Therefore, it is possible to form the coating layer 11 excellent in joinability and wear resistance without relying on a complicated step.

The thickness of the first AlTi layer 13 is not limited to a specific value, but may be set to 5 nm to 100 nm, for example. The thickness of each of the plurality of first AlTi layers 13 may be constant, or the thickness of some of the first AlTi layers 13 may be different from one another.

The coating layer 11 may be located on the base member 9 by using, for example, physical vapor deposition method as in the first embodiment. As one example of the deposition with the ion plating method, the coating layer 11 of the second embodiment may be deposited with the following method.

In a first procedure, as in the first embodiment, a metal target independently including aluminum and titanium, a composite alloy target or a sintered body target is prepared. The ionized target is reacted with nitrogen gas as a nitrogen source, and methane gas or acetylene gas as a carbon source, and is deposited on the surface of the base member 9. The first AlTi layer 13 may be formed through the above procedure.

In a second procedure, as in the first embodiment, a metal target independently including aluminum and titanium, a composite alloy target or a sintered body target is prepared. At this time, a target higher in content ratio of aluminum than the target prepared in the first procedure is prepared. The ionized target is reacted with nitrogen gas as a nitrogen source, and methane gas or acetylene gas as a carbon source, and is deposited on the surface of the base member 9. The second AlTi layer 15 may be formed through the above procedure.

The coating layer 11 including a configuration in which the plurality of first AlTi layers 13 and the plurality of second AlTi layers 15 are alternately located one upon another in a direction away from the base member 9 may be formed by alternately repeating the first procedure and the second procedure. There is no problem even if the first procedure is carried out after the second procedure.

When repeating the second procedure, for example, the thicknesses of the plurality of second AlTi layers 15 can be changed by changing the current value during discharge such as arc discharge and glow discharge. Specifically, when repeating the second procedure, by increasing the current value, the second region 15a in which, of the adjacent two second AlTi layers 15, the second AlTi layer 15 located farther away from the base member 9 is larger in thickness than the second AlTi layer 15 located closer to the base member 9 may be manufactured.

Third Embodiment

The coated tool 1 in the third embodiment is described below with reference to the drawings. However, the coated tool 1 of the third embodiment differs from the coated tool 1 of the first and second embodiments in the following points, which are mainly described in detail below. Descriptions of configurations similar to those in the coated tool 1 of the first and second embodiments may be omitted here.

The coated tool 1 in the third embodiment has a quadrangular plate shape and includes the first surface 3 (upper surface in FIG. 15) having a quadrangular shape, the second surface 5 (side surface in FIG. 15), and the cutting edge 7 located on at least a part of a ridge line where the first surface 3 intersects with the second surface 5.

Figure 15:
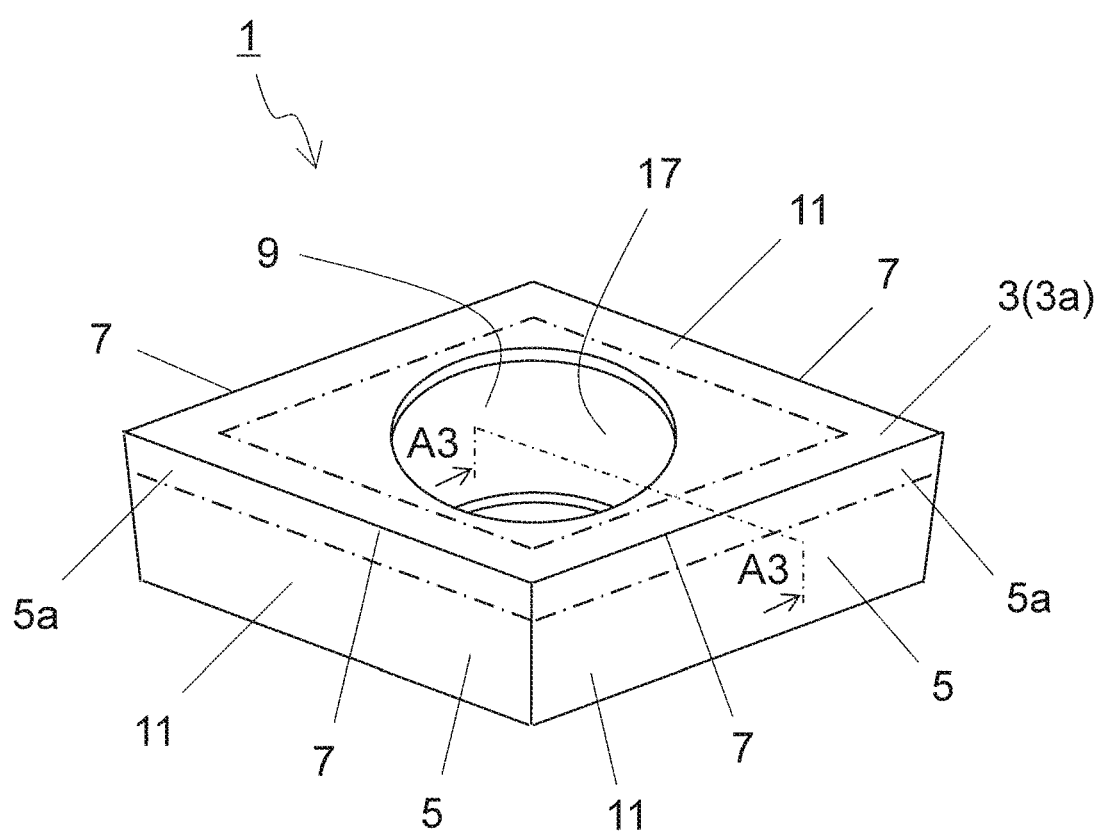
FIG. 15 is a perspective view illustrating a coated tool in a third embodiment.
Figure 16:
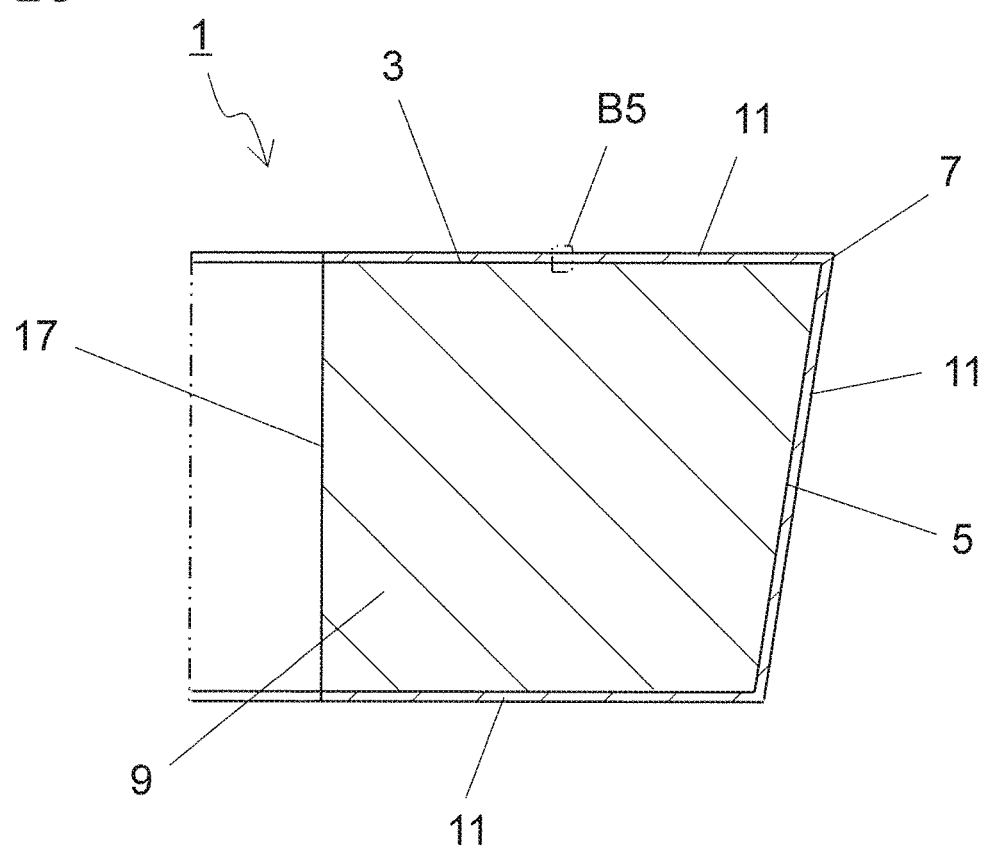
FIG. 16 is a sectional view taken along line A3-A3 in the coated tool illustrated in FIG. 15.

The coated tool 1 shown in FIG. 15 includes a base member 9 having the quadrangular plate shape and a coating layer 11 that coats a surface of the base member 9, an in the example shown in FIG. 1. The coating layer 11 may cover the whole or only a part of the surface of the base member 9.

Figure 17:
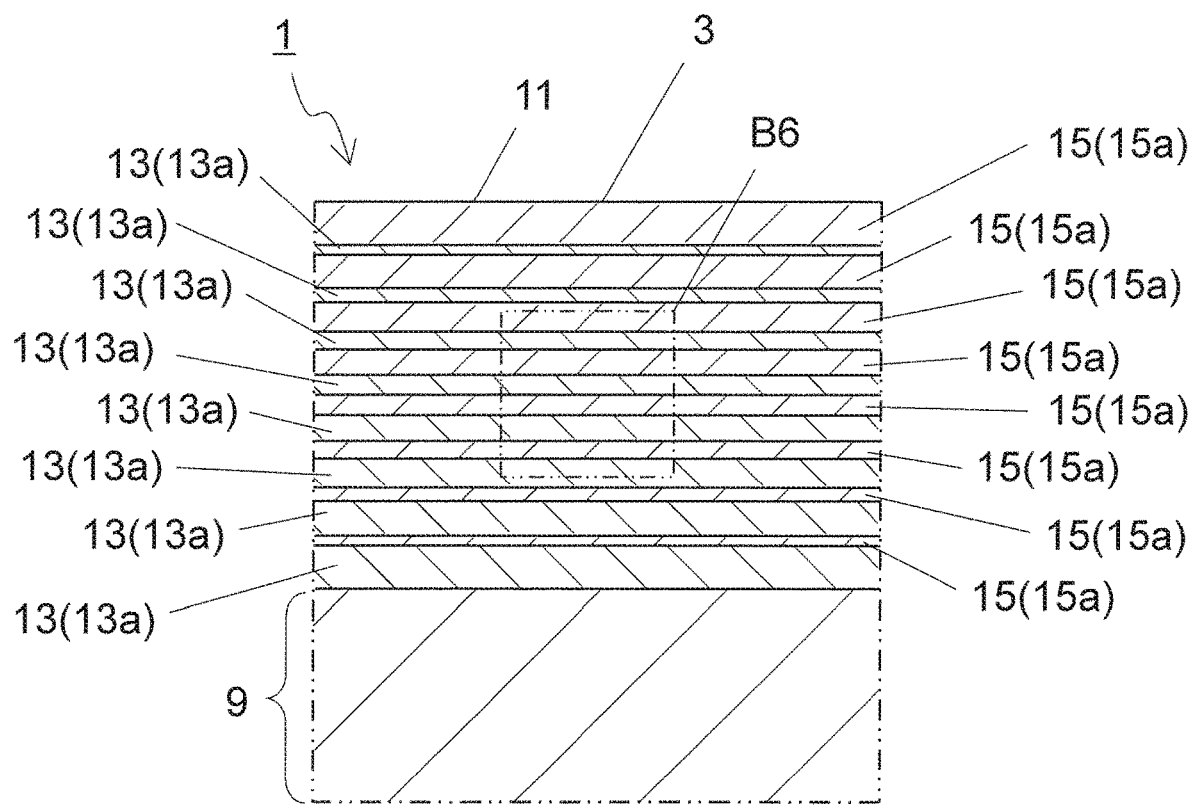
FIG. 17 is an enlarged view of a region B5 illustrated in FIG. 16.
Figure 18:
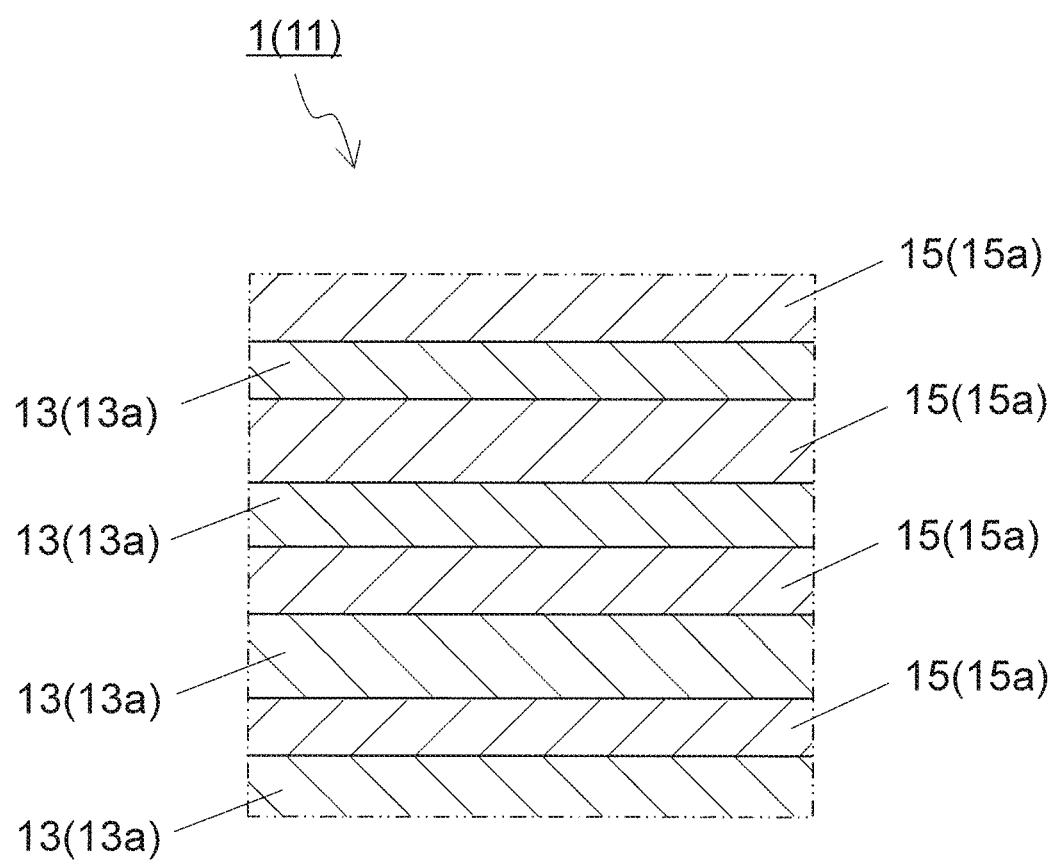
FIG. 18 is an enlarged view of a region B6 illustrated in FIG. 17.
Figure 19:
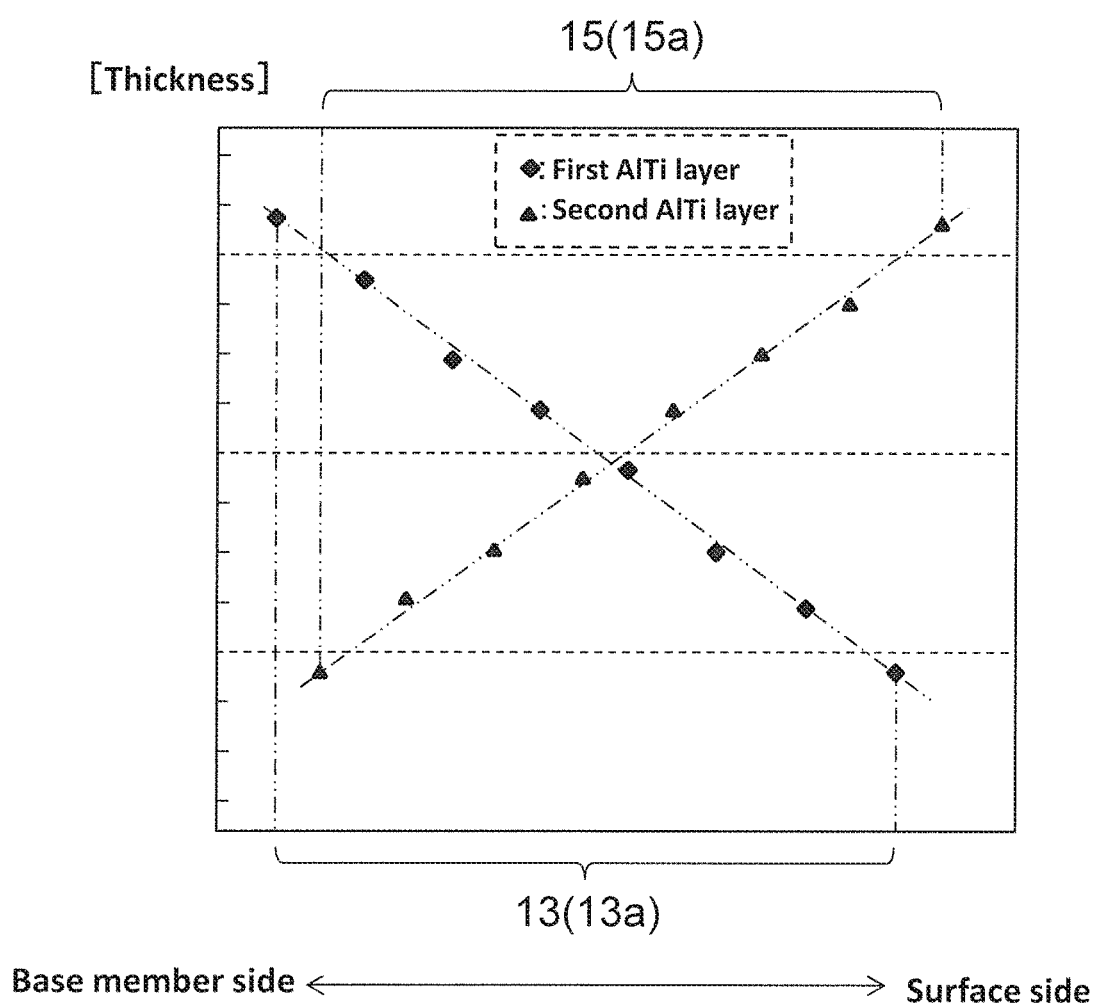
FIG. 19 is a graph indicating the thicknesses of the first AlTi layer and the second AlTi layer in the coated tool illustrated in FIG. 15.

The coating layer 11 includes the plurality of first AlTi layers 13 that include aluminum and titanium as a main component and the plurality of second AlTi layers 15 that include aluminum and titanium as a main component as illustrated in FIGS. 17 and 18. The coating layer 11 includes a configuration in which the plurality of first AlTi layers 13 and the plurality of second AlTi layers 15 are alternately located one upon another in a direction away from the base member 9.

In the third embodiment, the plurality of first AlTi layers 13 include the first region 13a in which, of adjacent two first AlTi layers 13, the first AlTi layer 13 located farther away from the base member 9 is smaller in thickness than the first AlTi layer 13 located closer to the base member 9. The plurality of second AlTi layers 15 include the second region 15a in which, of adjacent two of the second AlTi layers 15, the second AlTi layer 15 located farther away from the base member 9 is larger in thickness than the second AlTi layer 15 located closer to the base member 9.

Thus, the coated tool 1 of the third embodiment includes both the characteristic configuration of the plurality of first AlTi layers 13 in the first embodiment and the characteristic configuration of the plurality of second AlTi layers 15 in the second embodiment.

In a case where the coating layer 11 includes the first region 13a, the ratio of the second AlTi layer 15 to the first AlTi layer 13 is high on the side of the first region 13a away from the base member 9, and the ratio of the first AlTi layer 13 to the second AlTi layer 15 is high on the side of the first region 13a close to the base member 9.

In a case where the coating layer 11 includes the second region 15a, the ratio of the second AlTi layer 15 to the first AlTi layer 13 is further high on the side of the second region 15a away from the base member 9, and the ratio of the first AlTi layer 13 to the second AlTi layer 15 is further high on the side of the second region 15a close to the base member 9.

Thus, in a case where the coating layer 11 includes both the first region 13a and the second region 15a, the coating layer 11 is extremely excellent in both wear resistance and joinability.

All of the plurality of first AlTi layers 13 may be included in the first region 13a, or only a part of the plurality of first AlTi layers 13 may be included in the first region 13a. All of the plurality of second AlTi layers 15 may be included in the second region 15a, or only a part of the plurality of second AlTi layers 15 may be included in the second region 15a.

In the example shown in FIG. 17, all of the plurality of first AlTi layers 13 are included in the first region 13a, and all of the plurality of second AlTi layers 15 are included in the second region 15a. In this case, the joinability and wear resistance of the coating layer 11 are further enhanced.

In the first region 13a of the example shown in FIGS. 17 and 18, the change amount in thickness of the plurality of first AlTi layers 13 is constant. That is, when three or more of the first AlTi layers 13 are in the first region 13a, the difference in thickness between adjacent two first AlTi layers 13 is equal to the difference in thickness between different adjacent two first AlTi layers 13. In the second region 15a of the example shown in FIGS. 17 and 18, the change amount in thickness of the plurality of second AlTi layers 15 is constant. That is, when three or more of the second AlTi layers 15 are in the second region 15a, the difference in thickness between adjacent two second AlTi layers 15 is equal to the difference in thickness between different adjacent two second AlTi layers 15.

The difference in thickness between adjacent two of the first AlTi layers 13 in the first region 13a may be different from but may otherwise be the same as the difference in thickness between adjacent two of the second AlTi layers 15 in the second region 15a. When the differences in these thicknesses are the same, both the wear resistance and the joinability of the coating layer 11 are excellent, and the durability of the coating layer 11 is further enhanced.

This is because the ratio of the second AlTi layer 15 excellent in wear resistance is high on the side in the first region 13a away from the base member 9 and the ratio of the first AlTi layer 13 excellent in joinability is high on the side of the base member 9 in the first region 13a, while avoiding an excessive increase in the difference in thickness of the first AlTi layers 13 adjacent in the lamination direction and the difference in thickness of the second AlTi layers 15 adjacent in the lamination direction.

Figure 20:
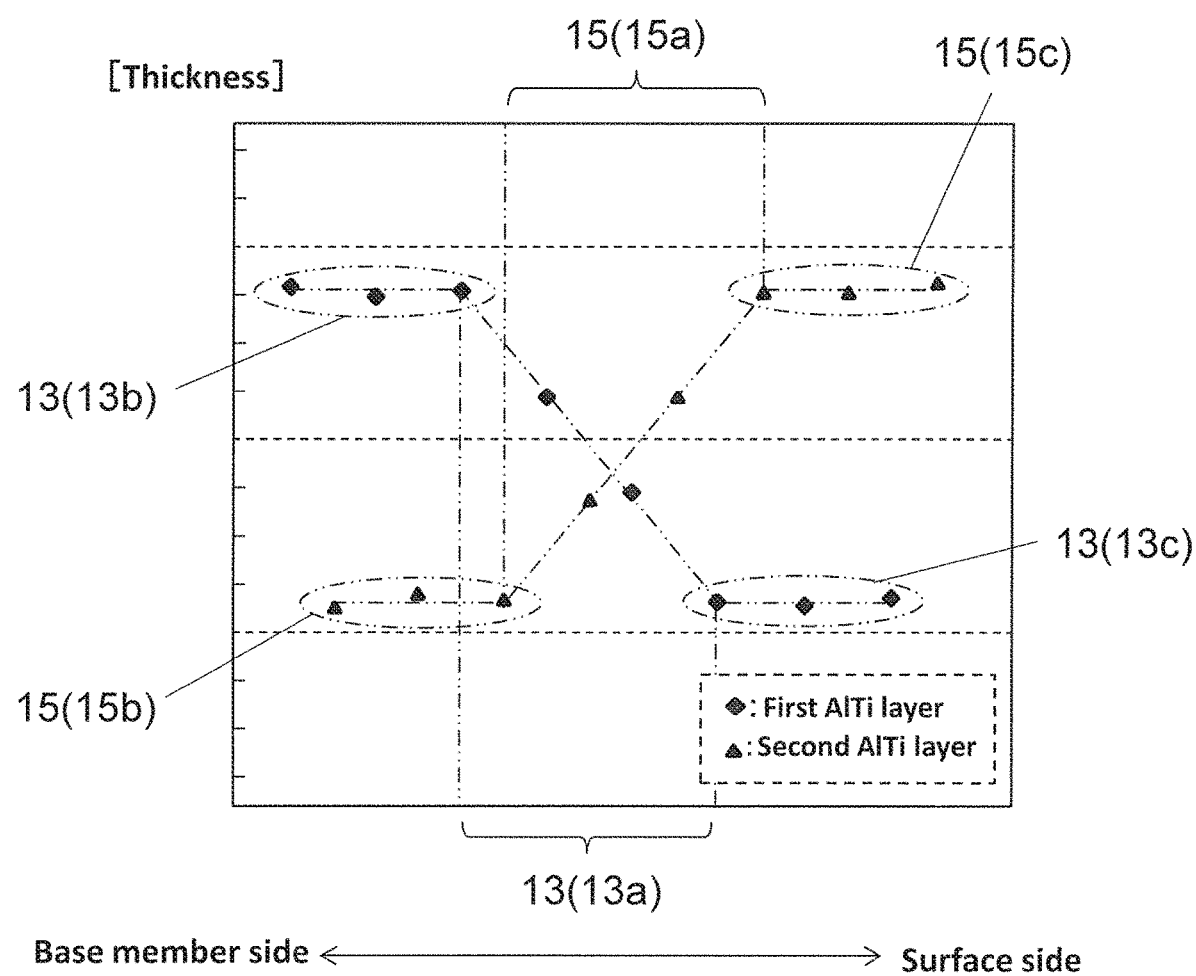
FIG. 20 is a graph indicating the thicknesses of the first AlTi layer and the second AlTi layer in a fifth modification of the coated tool illustrated in FIG. 19.

In the modification shown in FIG. 20, only a part of the plurality of first AlTi layers 13 is included in the first region 13a, and only a part of the plurality of second AlTi layers 15 is included in the second region 15a. Specifically, among the plurality of first AlTi layers 13 and the plurality of second AlTi layers 15 constituting the coating layer 11, the thicknesses of a part of the first AlTi layers 13 and a part of the second AlTi layers 15 located close to the base member 9 are constant.

In the modification shown in FIG. 20, among the plurality of first AlTi layers 13 and the plurality of second AlTi layers 15 constituting the coating layer 11, the thicknesses of a part of the first AlTi layers 13 and the second AlTi layers 15 located away from the base member 9 are constant.

Figure 21:
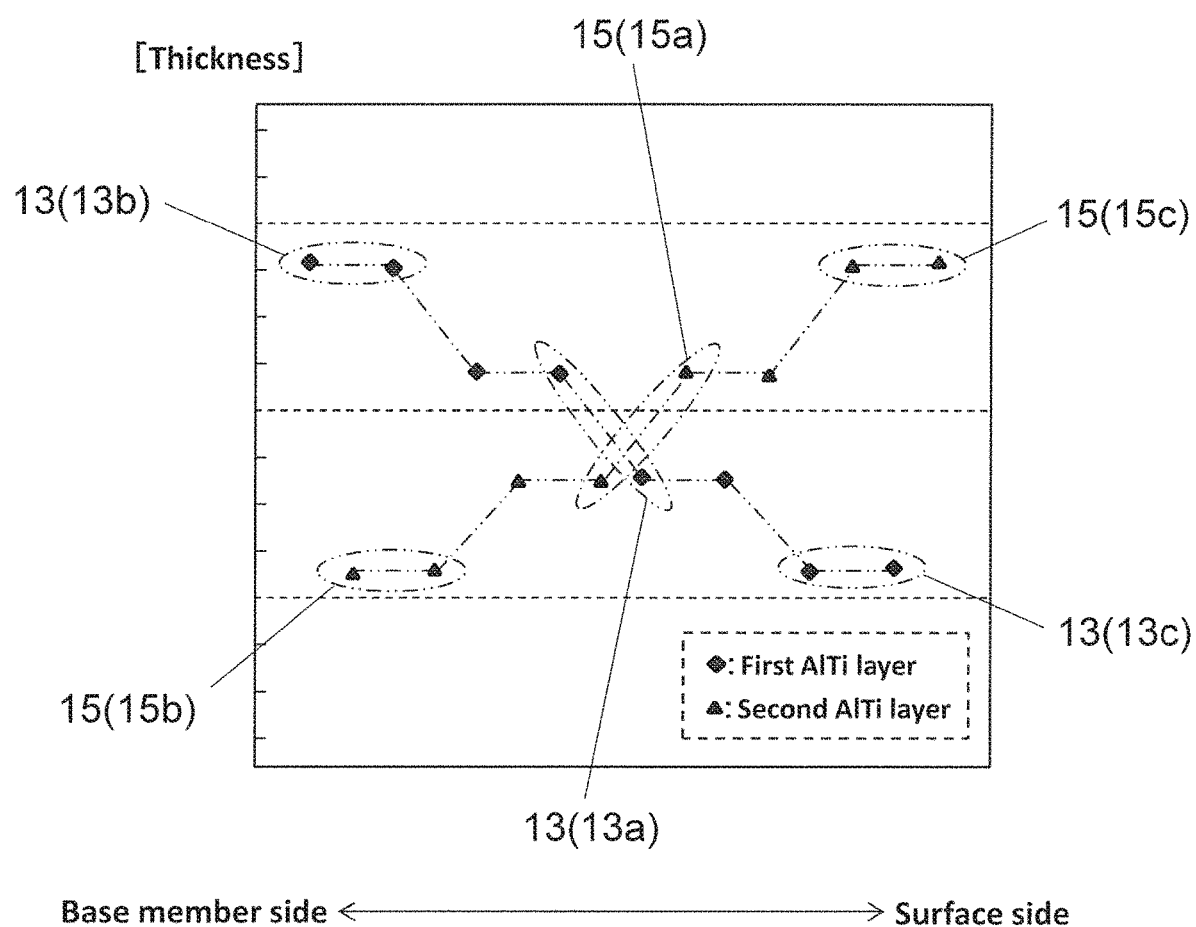
FIG. 21 is a graph indicating the thicknesses of the first AlTi layer and the second AlTi layer in a sixth modification of the coated tool illustrated in FIG. 19.

In the modification shown in FIG. 21, the plurality of first AlTi layers 13 and the plurality of second AlTi layers 15 constituting the coating layer 11 are divided into a plurality of sections in the lamination direction. The thicknesses of the plurality of first AlTi layers 13 and the second AlTi layers 15 included in each section are constant, and the farther a section is located away from the base member 9, the smaller the thickness of the first AlTi layer 13 included in the section is and the larger the thickness of the second AlTi layer 15 included in the section is. In the modification shown in FIG. 21, the first region 13a is constituted by a pair of first AlTi layers 13 located at a boundary between adjacent sections, and the second region 15a is constituted by a pair of second AlTi layers 15 located at a boundary between adjacent sections.

A cutting tool 101 in the embodiments is described below with reference to the drawings.

Figure 22:
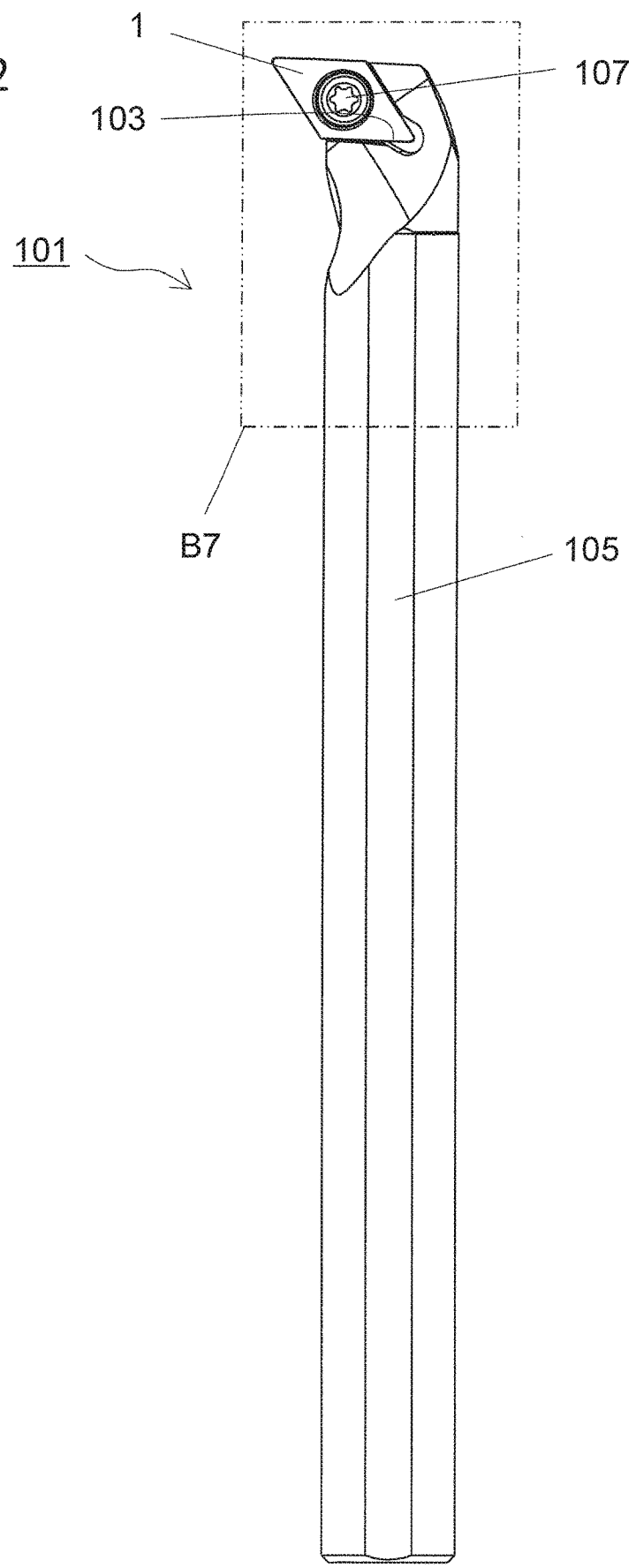
FIG. 22 is a plan view illustrating a cutting tool in the embodiments.
Figure 23:
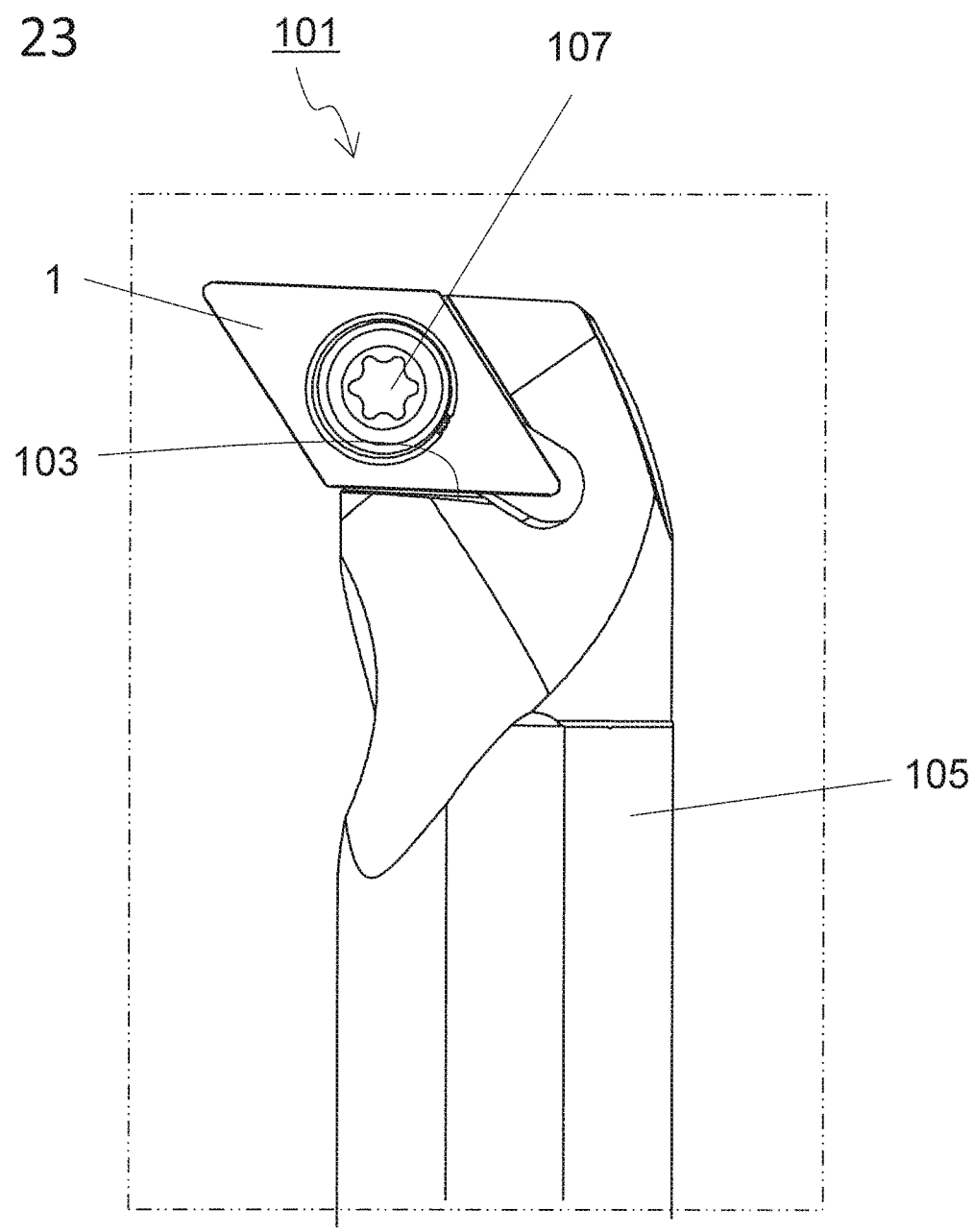
FIG. 23 is an enlarged view of a region B7 illustrated in FIG. 22.

As illustrated in FIG. 22, the cutting tool 101 in the embodiments is a bar-shaped body extended from a first end (an upper end in FIG. 22) to a second end (a lower end in FIG. 22). As illustrated in FIG. 23, the cutting tool 101 includes a holder 105 with a pocket 103 located at a side of the first end, and the coated tool 1 represented by the above embodiment located in the pocket 103.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached so that at least a part of a ridge line where a first surface intersects with a second surface, which is usable as a cutting edge, is protruded outward from the holder 105. The coated tool 1 is attached to the holder 105 by a fixing screw 107 in the embodiment. Specifically, the coated tool 1 is attachable to the holder 105 in such a manner that screw parts are engaged with each other by inserting the fixing screw 107 into the through hole of the coated tool 1, and by inserting a front end of the fixing screw 107 into a screw hole (not illustrated) formed in the pocket 103.

For example, steel and cast iron are usable as the holder 105. Of these materials, high toughness steel is preferably used.

The embodiments have illustrated and described the cutting tools for use in the so-called turning process. Examples of the turning process include inner diameter processing, outer diameter processing and grooving process. The cutting tools are not limited to ones which are used for the turning process. For example, the coated tools 1 of the above embodiments are applicable to the cutting tools for use in the milling process.

Method of Manufacturing Machined Product

A method of manufacturing a machined product in the embodiments is described below with reference to the drawings.

The machined product is manufacturable by carrying out a cutting process of a workpiece 201. The method for manufacturing a machined product in the embodiments includes the following steps: (1) rotating the workpiece 201;

(2) bringing the cutting tool 101 represented by the above embodiments into contact with the workpiece 201 being rotated; and (3) moving the cutting tool 101 away from the workpiece 201.

Figure 24:
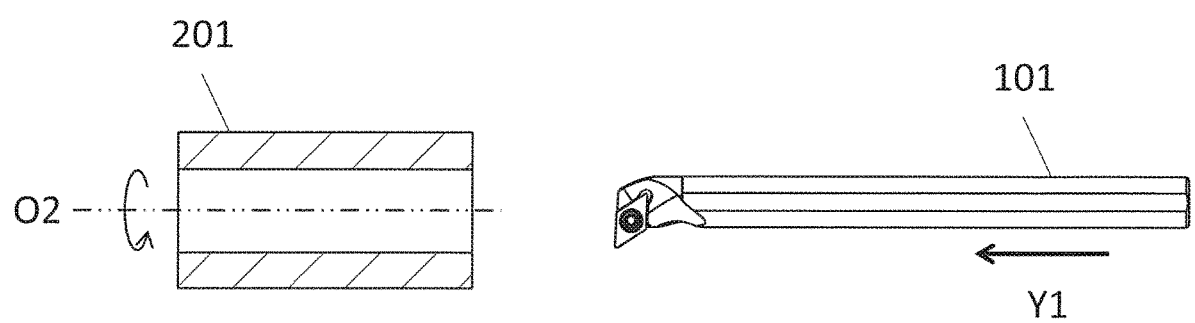
FIG. 24 is a schematic diagram illustrating a step in a method of manufacturing a machined product in the embodiments.
Figure 25:
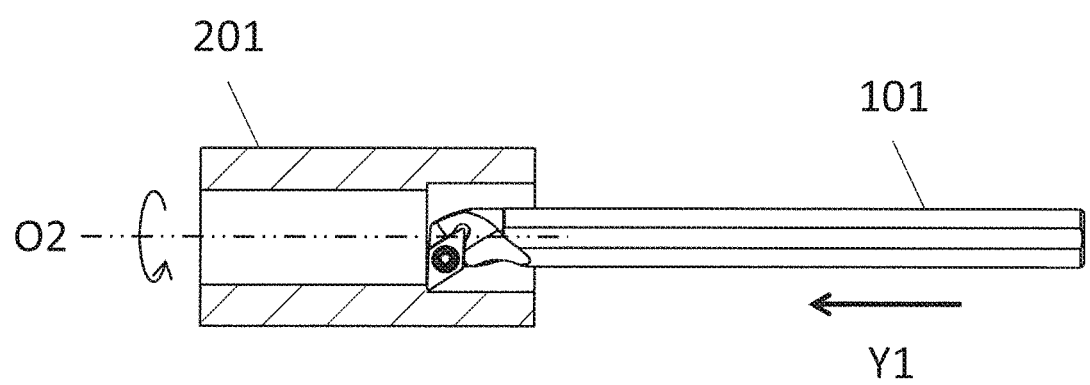
FIG. 25 is a schematic diagram illustrating a step in a method of manufacturing a machined product in the embodiments.
Figure 26:
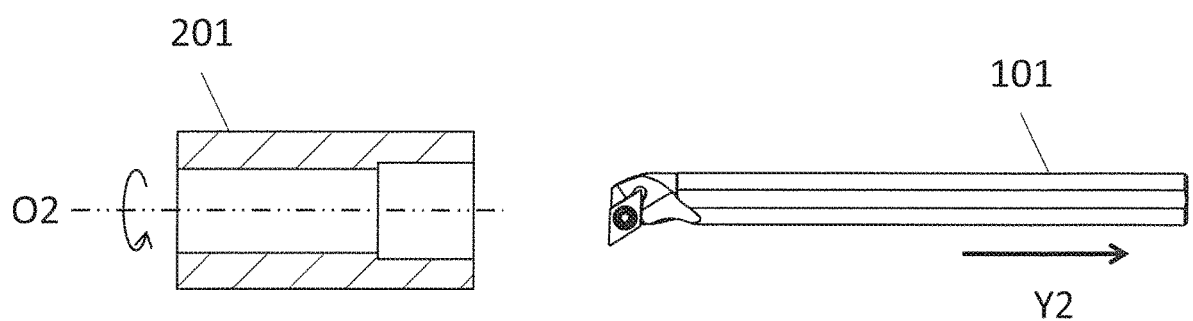
FIG. 26 is a schematic diagram illustrating a step in a method of manufacturing a machined product in the embodiments.

More specifically, firstly, the workpiece 201 is rotated around an axis O2, and the cutting tool 101 is relatively brought near the workpiece 201 as illustrated in FIG. 24. Then, the workpiece 201 is cut out by bringing the cutting edge in the cutting tool 101 into contact with the workpiece 201 as illustrated in FIG. 25. Thereafter, the cutting tool 101 is relatively moved away from the workpiece 201 as illustrated in FIG. 26.

In the present embodiments, the cutting tool 101 is brought near the workpiece 201 by fixing the axis O2, and by moving the cutting tool 101 in Y1 direction in a state in which the workpiece 201 is rotated around the axis O2. In FIG. 25, the workpiece 201 is cut out by bringing the cutting edge in an insert 1 into contact with the workpiece 201 being rotated. In FIG. 26, the cutting tool 101 is moved away by being moved in Y2 direction in a state in which the workpiece 201 is rotated.

During the cutting process with the manufacturing method of the embodiments, the cutting tool 101 is brought into contact with the workpiece 201, or the cutting tool 101 is moved away from the workpiece 201 by moving the cutting tool 101 in each of the steps. However, there is no intention to limit to the above embodiments.

For example, the workpiece 201 may be brought near the cutting tool 101 in the step (1). Similarly, the workpiece 201 may be moved away from the cutting tool 101 in the step (3). When the cutting process is continued, it is necessary to repeat the step of bringing the cutting edge in the insert 1 into contact with different portions of the workpiece 201, while keeping the workpiece 201 rotated.

Representative examples of material of the workpiece 201 include carbon steel, alloy steel, stainless steel, cast iron, and nonferrous metals.

DESCRIPTION OF THE REFERENCE NUMERAL

1: Coated tool
3: First surface
3a: Rake surface region
5: Second surface
5a: Flank surface region
7: Cutting edge
9: Base member
11: Coating layer
13: First AlTi layer
13a: First region
15: Second AlTi layer
15a: Second region
17: Through hole
101: Cutting tool
103: Pocket
105: Holder
107: Fixing screw
201: Workpiece

What is claimed is:

1. A coated tool comprising:
a base member; and
a coating layer arranged on the base member;
wherein
the coating layer comprises:
a plurality of first AlTi layers with an atomic ratio of aluminum to titanium indicated by $Al_{1-x1}Ti_{x1}$; and
a plurality of second AlTi layers with an atomic ratio of aluminum to titanium indicated by $Al_{1-x2}Ti_{x2}$;
wherein the coating layer comprises a configuration in which the first AlTi layers and the second AlTi layers are alternately located one upon another in a direction away from the base member;
the x1 is larger than the x2;
the plurality of first AlTi layers comprises a first region comprising two or more adjacent first AlTi layers, wherein the a first AlTi layer of the two or more adjacent first AlTi layers is located farther away from the base member and is smaller in thickness than a first AlTi layer of the two or more adjacent first AlTi layers is located closer to the base member; and
wherein the two or more adjacent first AlTi layers comprise three or more first AlTi layers, wherein a difference in thickness between a first set of two adjacent first AlTi layers is equal to a difference in thickness between a second set of two adjacent first AlTi layers.

2. The coated tool according to claim 1, wherein the plurality of first AlTi layers further comprises two adjacent first AlTi layers that are equal in thickness to each other.

3. A coated tool comprising:
a base member; and
a coating layer arranged on the base member;
wherein
the coating layer comprises:
a plurality of first AlTi layers with an atomic ratio of aluminum to titanium indicated by $Al_{1-x1}Ti_{x1}$; and
a plurality of second AlTi layers with an atomic ratio of aluminum and titanium indicated by $Al_{1-x2}Ti_{x2}$;
wherein the coating layer comprising a configuration in which the first AlTi layers and the second AlTi layers are alternately located one upon another in a direction away from the base member;
the x1 is larger than the x2;
the plurality of second AlTi layers comprises a second region comprising two or more adjacent second AlTi layers, wherein a second AlTi layer of the two or more adjacent second AlTi layers is located farther away from the base member and is larger in thickness than a second AlTi layer of the two or more adjacent second AlTi layers located closer to the base member; and
wherein the two or more adjacent second AlTi layers comprises three or more second AlTi layers, wherein a difference in thickness between a first set of two adjacent second AlTi layers is equal to a difference in thickness between a second set of two adjacent second AlTi layers.

4. The coated tool according to claim 3, wherein the plurality of second AlTi layers further comprises two adjacent second AlTi layers that are equal in thickness to each other.

5. The coated tool according to claim 3, wherein the plurality of first AlTi layers comprises a first region comprising two or more adjacent first AlTi layers, wherein a first AlTi layer of the two or more adjacent first AlTi layers is located farther away from the base member and is smaller in thickness than a first AlTi layer of the two or more adjacent first AlTi layers is located closer to the base member.

6. The coated tool according to claim 5, wherein the two or more adjacent first AlTi layers comprise three or more first AlTi layers, wherein a difference in thickness between a first set of two adjacent first AlTi layers is equal to a difference in thickness between a second set of two adjacent first AlTi layers, and
wherein the two or more adjacent second AlTi layers comprise three or more second AlTi layers, wherein a difference in thickness between a first set of two adjacent second AlTi layers is equal to a difference in thickness between a second set of two adjacent second AlTi layers.

7. The coated tool according to claim 1, wherein the x1 is larger than 0.5 and x2 is smaller than 0.5.

8. A cutting tool comprising:
a holder comprising a pocket located at a side of a front end of the holder; and
a coated tool according to claim 1, wherein the coated tool is located in the pocket.

9. A method for manufacturing a machined product, comprising:
rotating a workpiece;
bringing a cutting tool according to claim 8 into contact with the workpiece; and
moving the cutting tool away from the workpiece.

10. The coated tool according to claim 3, wherein the x1 is larger than 0.5 and x2 is smaller than 0.5.

11. A cutting tool comprising:
a holder comprising a pocket located at a side of a front end of the holder; and
a coated tool according to claim 3; wherein the coated tool is located in the pocket.

12. A method for manufacturing a machined product; wherein the method comprises:
rotating a workpiece;
bringing a cutting tool according to claim 11 into contact with the workpiece; and
moving the cutting tool away from the workpiece.

13. A coated tool comprising:
a base member; and
a coating layer arranged on the base member;
wherein
the coating layer comprises:
a plurality of first AlTi layers with an atomic ratio of aluminum to titanium indicated by $Al_{1-x1}Ti_{x1}$; and
a plurality of second AlTi layers with an atomic ratio of aluminum and titanium indicated by $Al_{1-x2}Ti_{x2}$;
wherein the coating layer comprising a configuration in which the first AlTi layers and the second AlTi layers are alternately located one upon another in a direction away from the base member;
the x1 is larger than the x2;
the plurality of second AlTi layers comprises a second region comprising two or more adjacent second AlTi layers, wherein a second AlTi layer of the two or more adjacent second AlTi layers is located farther away from the base member and is larger in thickness than a second AlTi layer of the two or more adjacent second AlTi layers located closer to the base member;
wherein the plurality of first AlTi layers comprises a first region comprising two or more adjacent first AlTi layers, wherein a first AlTi layer of the two or more adjacent first AlTi layers is located farther away from the base member and is smaller in thickness than a first AlTi layer of the two or more adjacent first AlTi layers is located closer to the base member; and
wherein the two or more adjacent first AlTi layers comprise three or more first AlTi layers, wherein a difference in thickness between a first set of two adjacent first AlTi layers is equal to a difference in thickness between a second set of two adjacent first AlTi layers, and
wherein the two or more adjacent second AlTi layers comprise three or more second AlTi layers, wherein a difference in thickness between a first set of two adjacent second AlTi layers is equal to a difference in thickness between a second set of two adjacent second AlTi layers.

14. The coated tool according to claim 13, wherein the x1 is larger than 0.5 and x2 is smaller than 0.5.

15. A cutting tool comprising:
a holder comprising a pocket located at a side of a front end of the holder; and
a coated tool according to claim 13; wherein the coated tool is located in the pocket.

16. A method for manufacturing a machined product; wherein the method comprises:
rotating a workpiece;
bringing a cutting tool according to claim 15 into contact with the workpiece; and
moving the cutting tool away from the workpiece.

* * * * *